US012456418B2

(12) United States Patent
Lee et al.

(10) Patent No.: US 12,456,418 B2
(45) Date of Patent: Oct. 28, 2025

(54) ELECTRONIC DEVICE AND OPERATION METHOD THEREOF

(71) Applicant: Samsung Electronics Co., Ltd., Suwon-si (KR)

(72) Inventors: Jaesung Lee, Suwon-si (KR); Jungbae Bae, Suwon-si (KR); Joongyu Lee, Suwon-si (KR); Taewoong Lee, Suwon-si (KR); Kyungtae Kim, Suwon-si (KR); Kwangtai Kim, Suwon-si (KR); Donghyun Yeom, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 15 days.

(21) Appl. No.: 18/499,654

(22) Filed: Nov. 1, 2023

(65) Prior Publication Data

US 2024/0071300 A1 Feb. 29, 2024

Related U.S. Application Data

(63) Continuation of application No. PCT/KR2022/005611, filed on Apr. 19, 2022.

(30) Foreign Application Priority Data

May 3, 2021 (KR) ........................ 10-2021-0057290

(51) Int. Cl.
*G09G 3/3208* (2016.01)
*H10K 59/38* (2023.01)

(52) U.S. Cl.
CPC ........... *G09G 3/3208* (2013.01); *H10K 59/38* (2023.02); *G09G 2320/0242* (2013.01);
(Continued)

(58) Field of Classification Search
CPC .......... G09G 3/3208; G09G 5/00; G09G 5/10; G09G 2320/043; G09G 2360/16;
(Continued)

(56) References Cited

U.S. PATENT DOCUMENTS 7,872,256 B2 1/2011 Sung et al.
2011/0050747 A1 * 3/2011 Ishii .................... G09G 3/3208 345/690

(Continued)

FOREIGN PATENT DOCUMENTS

CN 105913800 A 8/2016
CN 111596485 A 8/2020

(Continued)

OTHER PUBLICATIONS

International Search Report dated Jul. 20, 2022, issued in International Patent Application No. PCT/KR2022/005611.

(Continued)

*Primary Examiner* — Lunyi Lao
*Assistant Examiner* — Sarvesh J Nadkarni
(74) *Attorney, Agent, or Firm* — Jefferson IP Law, LLP

(57) ABSTRACT

An electronic device is provided. The electronic device includes a display, at least one optical sensor, a display driver, at least one processor, and a memory. The display includes a plurality of pixels, and a plurality of color filters disposed on top of the plurality of pixels. The at least one optical sensor may generate an ultraviolet light exposure value in accordance with the exposure of the plurality of color filters to ultraviolet light. The display driver may control the driving of the display. The at least one processor may control the driving of the display driver. The memory may be operatively connected to the at least one processor. The memory may store instructions which, when executed, allow the at least one processor to calculate a radiation (Continued)

amount based on the value of exposure to ultraviolet rays and exposure time, and compensate color deviation of the plurality of pixels in accordance with deterioration of the plurality of color filters based on the radiation amount.

17 Claims, 17 Drawing Sheets

(52) U.S. Cl.
CPC ................. *G09G 2320/041* (2013.01); *G09G 2320/0673* (2013.01); *G09G 2360/144* (2013.01); *G09G 2360/16* (2013.01)

(58) Field of Classification Search
CPC ....... G09G 2360/144; G09G 2320/041; G09G 2320/0673; G09G 2320/0233; G09G 2320/0242; H10K 59/38
See application file for complete search history.

(56) References Cited

U.S. PATENT DOCUMENTS

| | | | | |
|---|---|---|---|---|
| 2011/0109768 | A1 | 5/2011 | Nakahira et al. | |
| 2014/0217924 | A1* | 8/2014 | Sato | G09G 3/2003 315/294 |
| 2014/0285477 | A1 | 9/2014 | Cho et al. | |
| 2015/0371579 | A1 | 12/2015 | Yu et al. | |
| 2017/0131447 | A1 | 5/2017 | De Keyzer et al. | |
| 2017/0162103 | A1 | 6/2017 | An et al. | |
| 2018/0247588 | A1* | 8/2018 | Lee | G09G 3/3225 |
| 2020/0265779 | A1 | 8/2020 | In | |
| 2020/0273915 | A1* | 8/2020 | Wang | H10K 59/873 |
| 2020/0348790 | A1* | 11/2020 | Vampola | G09G 3/3406 |
| 2020/0372875 | A1* | 11/2020 | Iyer | G06F 1/1681 |
| 2021/0074240 | A1 | 3/2021 | Park et al. | |
| 2023/0006178 | A1* | 1/2023 | Liu | H10K 71/00 |
| 2023/0236453 | A1 | 7/2023 | Zha | |

FOREIGN PATENT DOCUMENTS

| | | | |
|---|---|---|---|
| JP | 2011-103513 | A | 5/2011 |
| JP | 4714522 | B2 | 6/2011 |
| JP | 5446750 | B2 | 3/2014 |
| JP | 5534825 | B2 | 7/2014 |
| JP | 2014-154226 | A | 8/2014 |
| JP | 2015-092643 | A | 5/2015 |
| KR | 10-2000-0010958 | A | 2/2000 |
| KR | 10-2013-0076822 | A | 7/2013 |
| KR | 10-2015-0136052 | A | 12/2015 |
| KR | 10-2017-0067200 | A | 6/2017 |
| KR | 10-2018-0029160 | A | 3/2018 |
| KR | 10-2018-0051313 | A | 5/2018 |
| KR | 10-2018-0062108 | A | 6/2018 |
| KR | 10-2019-0088159 | A | 7/2019 |
| KR | 10-2019-0090219 | A | 8/2019 |
| KR | 10-1992310 | B1 | 9/2019 |
| KR | 10-2017866 | B1 | 9/2019 |
| KR | 10-2020-0082604 | A | 7/2020 |
| KR | 10-2020-0102032 | A | 8/2020 |
| KR | 10-2173545 | B1 | 11/2020 |
| KR | 10-2514946 | B1 | 3/2023 |

OTHER PUBLICATIONS

Korean Office Action dated Oct. 15, 2024, issued in Korean Patent Application No. 10-2021-0057290.

Korean Office Action dated May 8, 2025, issued in Korean Application No. 10-2021-0057290.

* cited by examiner

ELECTRONIC DEVICE AND OPERATION METHOD THEREOF

CROSS-REFERENCE TO RELATED APPLICATION(S)

This application is a continuation application, claiming priority under § 365(c), of an International application No. PCT/KR2022/005611, filed on Apr. 19, 2022, which is based on and claims the benefit of a Korean patent application number 10-2021-0057290, filed on May 3, 2021, in the Korean Intellectual Property Office, the disclosure of which is incorporated by reference herein in its entirety.

BACKGROUND

1. Field

The disclosure relates to an electronic device and an operation method thereof.

2. Description of Related Art

A display of an electronic device is a key technology in the information and communication era, and is developing in the direction of thinner, lighter, more portable, and higher performance. For example, an organic light emitting diode (OLED) display is attracting attention as a flat panel display device that is capable of reducing the weight and volume that are disadvantages of a cathode ray tube (CRT). The OLED display may display an image by arranging a large number of pixels in a matrix form.

A top emission type of display (such as an OLED display) may have a reflectivity of about 60% with respect to external light. To reduce the reflection of external light, a polarizer (or polarizing film) is usually used, but the polarizer has a transmittance of about 50%, which reduces luminous efficiency of a pixel. In addition, the polarizer (or polarizing film) lowers the transmittance of the display (e.g., OLED display), and has limitations in application to under panel sensor (UPS) or under display camera (UDC) structure. In addition, the polarizer (or polarizing film) has a disadvantage in implementing a flexible OLED display as a mechanically inflexible structure.

The above information is presented as background information only to assist with an understanding of the disclosure. No determination has been made, and no assertion is made, as to whether any of the above might be applicable as prior art with regard to the disclosure.

SUMMARY

An on-cell color filter (OCF) structure is used as a replacement for a polarizer (or polarizing film) of a display (e.g., an OLED display). In a flexible OLED display, a color filter (CF) applied to the OCF structure needs to be able to be processed at a low temperature so that the color filter is deposited on top of the organic emission layer (EL) and plastic substrate. In addition, the color filter (CF) applied to the OCF structure needs to have a full width at half maximum (FWHM) with a narrow transmission spectrum to reflect external light and pass light through the EL layer. In addition, the color filter (CF) applied to the OCF structure needs to be mechanically flexible and reliable. A low temperature color filter (LTCF) is applied as a color filter that satisfies the conditions described above. The display (e.g., an OLED display) includes a low temperature color filter (LTCF) that replaces a polarizing layer (or polarizing film), but the LTCF is deteriorated by ultraviolet rays UV when the display is exposed to external light. There are problems that pixels with a deteriorated LTCF experience color distortion, degraded transmittance, and poor display quality.

Aspects of the disclosure are to address at least the above-mentioned problems and/or disadvantages and to provide at least the advantages described below. Accordingly, an aspect of the disclosure is to provide an electronic device and operation method thereof that compensates for deterioration of LTCFs of a bar-type OLED display, a foldable-type OLED display, or a slidable-type OLED display due to ultraviolet rays UV.

Additional aspects will be set forth in part in the description which follows and, in part, will be apparent from the description, or may be learned by practice of the presented embodiments.

In accordance with an aspect of the disclosure, an electronic device is provided. The electronic device includes a display, at least one optical sensor, a display driver, at least one processor, and a memory. The display includes a plurality of pixels and a plurality of color filters disposed on an upper portion of the plurality of pixels. The at least one optical sensor generates a value of exposure to ultraviolet rays based on the degree of exposure to ultraviolet rays of the plurality of color filters. The display driver controls driving of the display. The at least one processor controls driving of the display driver. The memory is operatively coupled to the at least one processor. The memory stores instructions which, when executed, allow the at least one processor to calculate a radiant exposure based on the value of exposure to ultraviolet rays and exposure time, and compensate color deviation of the plurality of pixels in accordance with deterioration of the plurality of color filters based on the radiant exposure.

An electronic device and operation method thereof, according to various embodiments of the disclosure, improves display quality of the electronic device by compensating for deterioration of LTCFs of a bar-type OLED display, a foldable-type OLED display, or a slidable-type OLED display due to ultraviolet rays UV. In addition, various effects that can be directly or indirectly identified through the document is provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
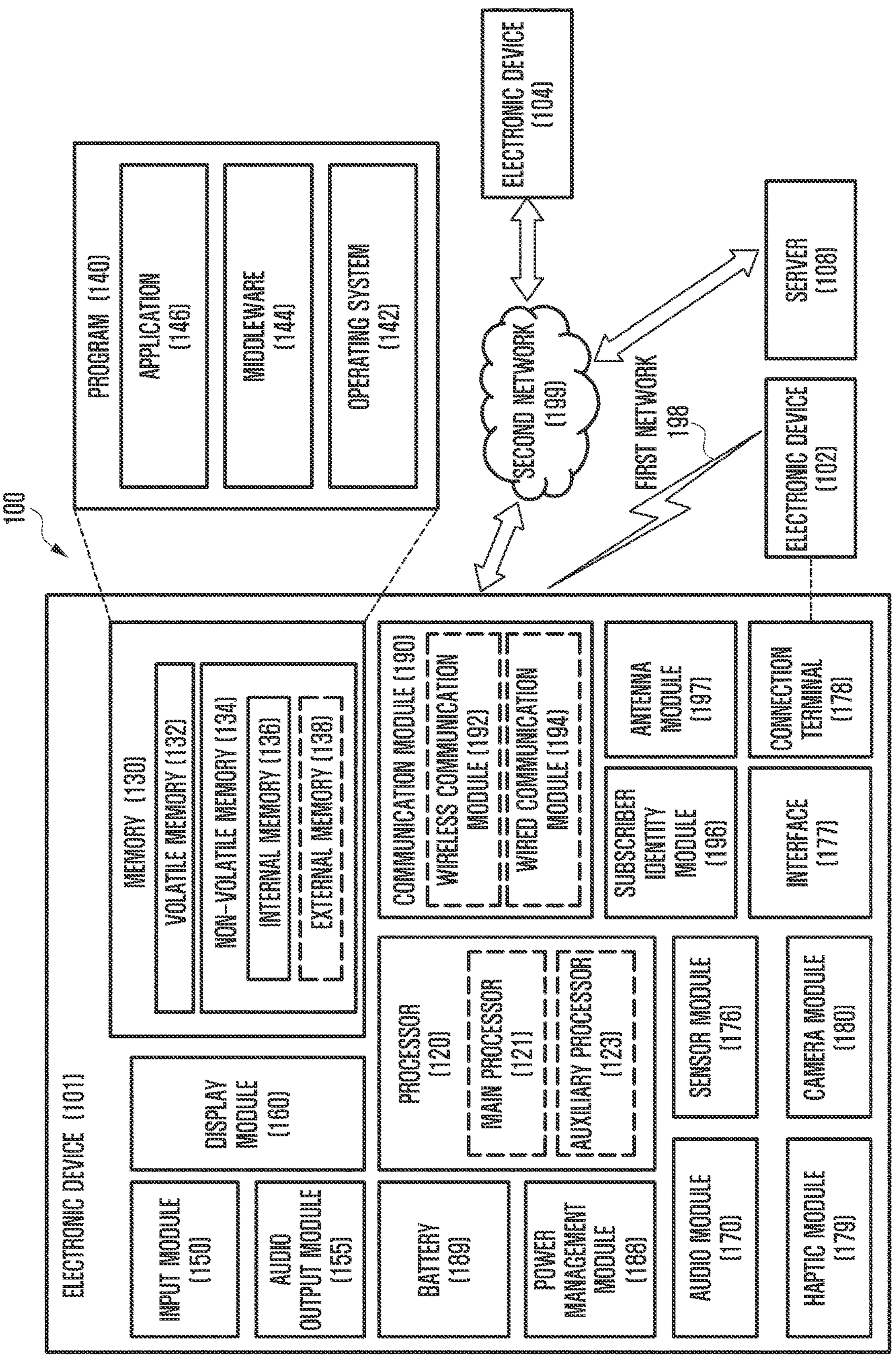
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module

190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 gigabits per second (Gbps) or more) for implementing eMBB, loss coverage (e.g., 164 dB or less) for implementing mMTC, or U-plane latency (e.g., 0.5 milliseconds (ms) or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., a smart home, a smart city, a smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

According to an embodiment of the disclosure, the display module 160 illustrated in FIG. 1 may include a flexible display constituted to allow a screen (e.g., a display screen) to be folded or unfolded.

According to an embodiment of the disclosure, the display module 160 illustrated in FIG. 1 may include a flexible display that is slidably disposed to provide a screen (e.g., a display screen).

According to an embodiment of the disclosure, the display module 160 illustrated in FIG. 1 is described as including a foldable display or a flexible display, but the disclosure is not limited thereto. The display module 160 may include a bar type or plate type of display.

Figure 2:
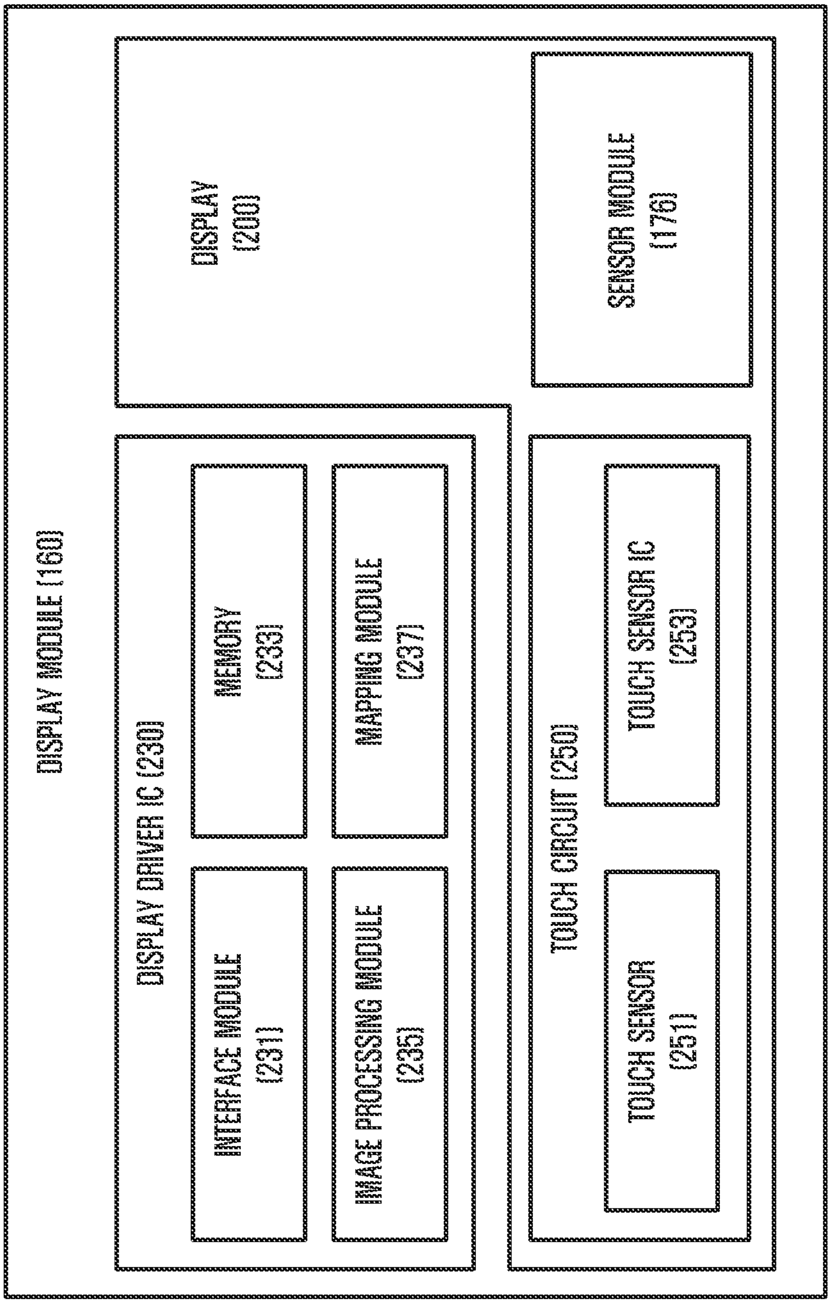
FIG. 2 is a block diagram of a display module according to an embodiment of the disclosure.

FIG. 2 is a block diagram of a display module according to an embodiment of the disclosure.

Referring to FIG. 2, the display module 160 may include a display 200, and a display driver integrated circuit (DDI) 230 (hereinafter referred to as "DDI 230") for controlling the display 200.

The DDI 230 may include an interface module 231, a memory 233 (e.g., buffer memory), an image processing module 235, and/or a mapping module 237.

According to an embodiment of the disclosure, the DDI 230 may receive image information, including image data, or an image control signal corresponding to a command to control the image data, from another constituent element of the electronic device 101 through the interface module 231.

According to an embodiment of the disclosure, the image information may be received from a processor (e.g., the processor 120 in FIG. 1) (e.g., the main processor 121 in FIG. 1) (e.g., an application processor) or an auxiliary processor (e.g., the auxiliary processor 123 in FIG. 1) (e.g., a graphics processing unit) operating independently of a function of the main processor 121.

According to an embodiment of the disclosure, the DDI 230 may communicate with a touch circuit 250 or sensor module 176 through the interface module 231. In addition, the DDI 230 may store at least some of the received image information in the memory 233. As an example, the DDI 230 may store at least a portion of the received image information in the memory 233 in units of frames.

According to an embodiment of the disclosure, the image processing module 235 may perform pre-processing or post-processing (e.g., resolution, brightness, or scaling) of at least a portion of the image data at least based on characteristics of the image data or characteristics of the display 200.

According to an embodiment of the disclosure, the mapping module 237 may generate a voltage value or a current value corresponding to the image data that has been pre-processed or post-processed through the image processing module 235. As an embodiment of the disclosure, generating the voltage value or current value may be performed based at least in part on properties of the pixels of the display 200 (e.g., arrangement of the pixels (RGB stripe or pentile structure), size of each sub-pixel, or deterioration of the pixels).

In an embodiment of the disclosure, at least some pixels of the display 200 may be driven based at least in part on the voltage value or current value such that visual information (e.g., text, images, or icons) corresponding to the image data may be displayed through the display 200.

According to an embodiment of the disclosure, the display module 160 may further include the touch circuit 250. The touch circuit 250 may include a touch sensor 251 and a touch sensor IC 253 for controlling the touch sensor.

In an embodiment of the disclosure, the touch sensor IC 253 may control the touch sensor 251 to detect a touch input or hovering input to a specific position of the display 200. For example, the touch sensor IC 253 may detect a touch input or hovering input by measuring a change in a signal (e.g., voltage, light intensity, resistance, or quantity of charge) for a specific position of the display 200. The touch sensor IC 253 may provide information (e.g., position, area, pressure, or time) on the detected touch input or hovering input to the processor (e.g., the processor 120 in FIG. 1).

According to an embodiment of the disclosure, at least a portion of the touch circuit 250 (e.g., the touch sensor IC 253) may be included as part of the display driver IC 230 or the display 200.

According to an embodiment of the disclosure, at least a portion of the touch circuit 250 (e.g., the touch sensor IC 253) may be included as part of another component element (e.g., the auxiliary processor 123) disposed externally of the display module 160.

According to an embodiment of the disclosure, the display module 160 may further include the sensor module 176 and/or a control circuit for the sensor module 176. The sensor module 176 may include at least one sensor (e.g., an ambient light sensor, a fingerprint sensor, an iris sensor, a pressure sensor, and/or an image sensor).

In this case, the at least one sensor or control circuit therefor may be embedded in a portion of the display module 160 (e.g., the display 200 or the DDI 230) or a portion of the touch circuit 250.

For example, in case that the sensor module 176 embedded in the display module 176 includes an ambient light sensor, the ambient light sensor may detect the amount of exposure of ultraviolet rays UV due to the exposure of the display to external light.

In another example, in case that the sensor module 176 embedded in the display module 160 includes a biometric sensor (e.g., a fingerprint sensor), the biometric sensor may obtain biometric information (e.g., a fingerprint image) associated with a touch input through some area of the display 200.

In still another example, in case that the sensor module 176 embedded in the display module 160 includes a pressure sensor, the pressure sensor may obtain pressure information associated with a touch input through some or all areas of the display 200. According to an embodiment of the disclosure, the touch sensor 251 or the sensor module 176 may be disposed between pixels in a pixel layer of the display 200, or on or underneath the pixel layer.

In another example, the sensor module 176 may be disposed in a bezel area of the electronic device (e.g., the electronic device 101 in FIG. 1).

Figure 3:
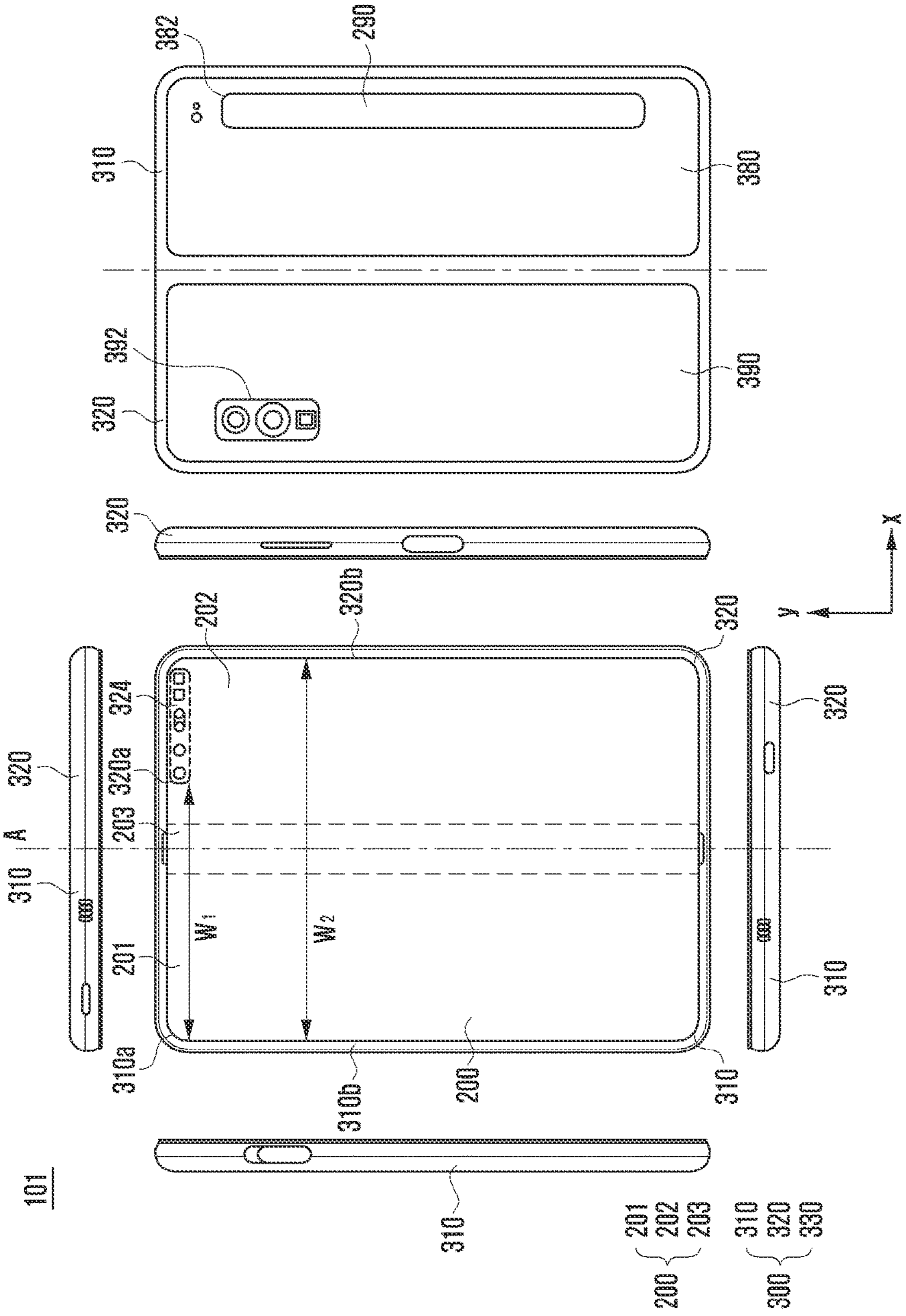
FIG. 3 is a view illustrating an unfolded (e.g., open) state of an electronic device according to an embodiment of the disclosure.
Figure 4:
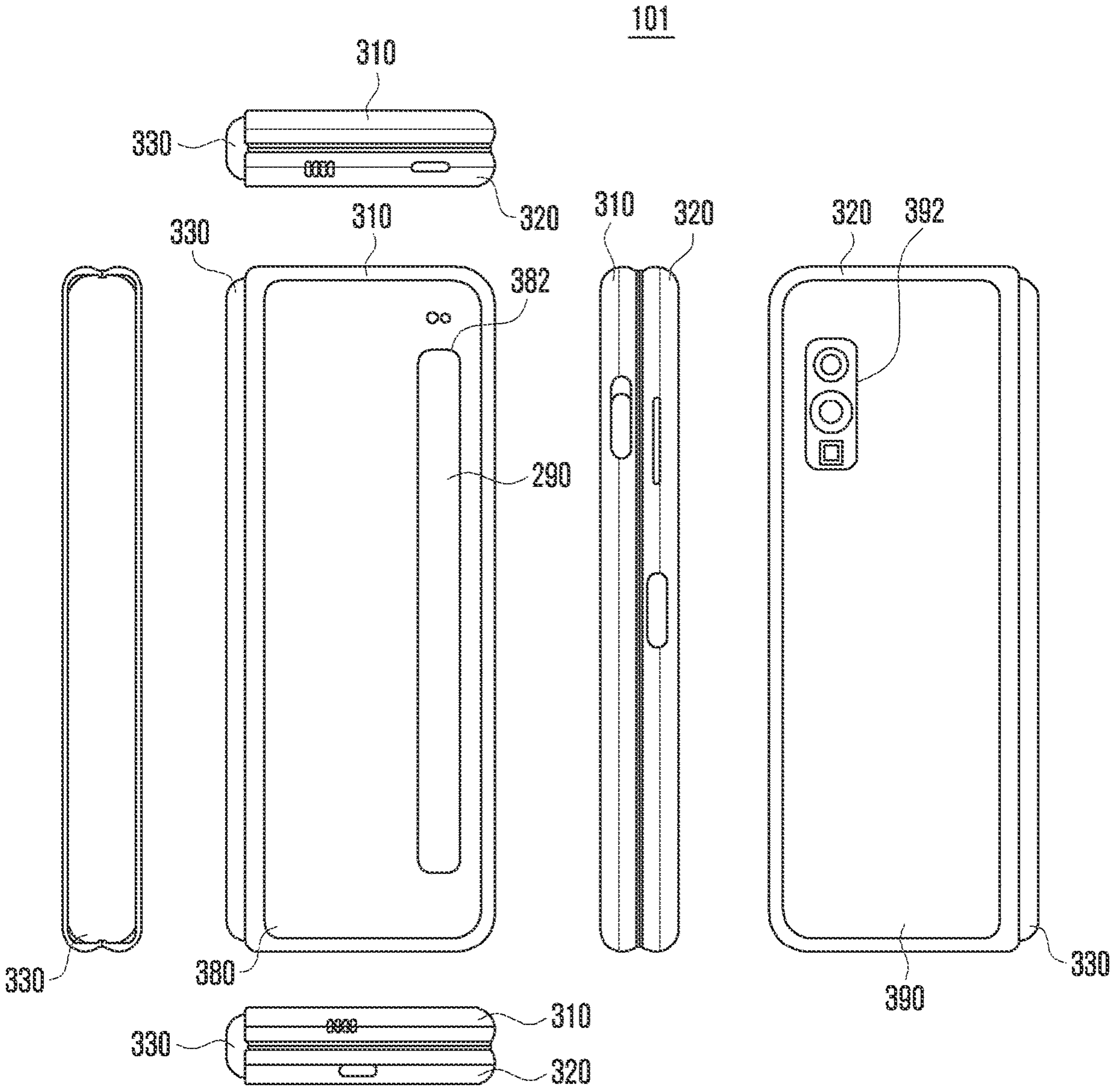
FIG. 4 is a view illustrating a folded (e.g., closed) state of an electronic device according to an embodiment of the disclosure.

FIG. 3 is a view illustrating an unfolded (e.g., open) state of an electronic device according to an embodiment of the disclosure. FIG. 4 is a view illustrating a folded (e.g., closed) state of an electronic device according to an embodiment of the disclosure.

Referring to FIGS. 3 and 4, the electronic device 101 may include a housing 300, a hinged cover 330 configured to cover a foldable portion of the housing 300, and the display 200 disposed within a space formed by the housing 300. In an embodiment of the disclosure, the display 200 may be a flexible display or a foldable display.

A surface on which the display 200 is disposed may be defined as a first surface or a front surface of the electronic device 101 (e.g., a surface on which a screen is displayed when unfolded). Further, an opposite surface of the front surface may be defined as a second surface or a rear surface of the electronic device 101. Further, a surface surrounding a space between the front surface and the rear surface may be defined as a third surface or a side surface of the electronic device 101. For example, the electronic device 101 may be folded or unfolded in a first direction (e.g., in the x-axis direction) relative to a folding area 203.

In an embodiment of the disclosure, the housing 300 may include a first housing structure 310, a second housing structure 320 including a sensor area 324, a first rear surface cover 380, and a second rear surface cover 390. The housing 300 of the electronic device 101 is not limited to shapes and couplings illustrated in FIGS. 3 and 4, and may be implemented by other shapes or combinations and/or couplings of parts. For example, in another embodiment of the disclosure, the first housing structure 310 and the first rear surface cover 380 may be integrally formed, and the second housing structure 320 and the second rear surface cover 390 may be integrally formed.

In the embodiment illustrated, the first housing structure 310 and the second housing structure 320 are disposed on both sides with respect to a folding axis A and may have a shape that is generally symmetrical with respect to the folding axis A. The first housing structure 310 and the second housing structure 320 may be at different angles or distances from each other depending on whether the electronic device 101 is in an unfolded state (e.g., a first state), a folded state (e.g., a second state), or an intermediate state (e.g., a third state). In the embodiment illustrated, the second housing structure 320, unlike the first housing structure 310, further includes the sensor area 324 where various sensors (e.g., an ambient light sensor, an iris sensor, and/or an image sensor) are disposed, but may have a mutually symmetrical shape in other areas.

In an embodiment of the disclosure, at least one sensor (e.g., an ambient light sensor, an iris sensor, and/or an image sensor) may be disposed on a lower portion of the display and/or the bezel area, in addition to the sensor area 324.

In an embodiment of the disclosure, the first housing structure 310 and the second housing structure 320 may together form a recess that accommodates the display 200. In the embodiment illustrated, the recess may have two or more widths that are different from each other in a direction that is perpendicular to the folding axis A (e.g., in the x-axis direction) due to the sensor area 324.

For example, the recess may have a first width W1 between a first portion 310*a* of the first housing structure 310 and a first portion 320*a* of the second housing structure 320 formed at an edge of the sensor area 324 in the second housing structure 320. The recess may have a second width W2 formed by a second portion 310*b* of the first housing structure 310 parallel to the folding axis A in the first housing structure 310 and a second portion 320*b* of the second housing structure 320 that is parallel to the folding axis A and does not correspond to the sensor area 324 in the second housing structure 320. In this case, the second width W2 may be formed longer than the first width W1. In other words, the first portion 310*a* of the first housing structure 310 and the first portion 320*a* of the second housing structure 320, which have mutually asymmetrical shapes, may form the first width W1 of the recess. The second portion 310*b* of the first housing structure 310 and the second portion 320*b* of the second housing structure 320, which have mutually symmetrical shapes, may form the second width W2 of the recess.

In an embodiment of the disclosure, the first portion 320*a* and the second portion 320*b* of the second housing structure 320 may have different distances from the folding axis A. The width of the recess is not limited to the example illustrated. In various embodiments of the disclosure, the recess may have a plurality of widths due to a shape of the sensor area 324 or portions of the first housing structure 310 and the second housing structure 320 that have asymmetrical shapes.

In an embodiment of the disclosure, at least a portion of the first housing structure 310 and the second housing structure 320 may be formed of a metallic or non-metallic material having a magnitude of stiffness selected to support the display 200.

In an embodiment of the disclosure, the sensor area 324 may be formed to have a predetermined area adjacent to one corner of the second housing structure 320. However, the disposition, shape, and size of the sensor area 324 are not limited to the example illustrated. For example, in another embodiment of the disclosure, the sensor area 324 may be provided in another corner of the second housing structure 320 or in any area between an upper end corner and a lower end corner thereof. In an embodiment of the disclosure, components for performing various functions embedded in the electronic device 101 may be exposed to the front surface of the electronic device 101 through the sensor area 324, or through one or more openings provided in the sensor area 324. In various embodiments of the disclosure, the components may include various types of sensors. The sensors may include, for example, at least one of an ambient light sensor, a front surface camera, a receiver, or a proximity sensor.

The first rear surface cover 380 may be disposed on the rear surface of said electronic device at one side of the folding axis A and may have a substantially rectangular periphery, for example, and the periphery may be enclosed by the first housing structure 310. Similarly, the second rear surface cover 390 may be disposed on the rear surface of the electronic device at the other side of the folding axis A, and may have a periphery enclosed by the second housing structure 320.

In the embodiment illustrated, the first rear surface cover 380 and the second rear surface cover 390 may have substantially symmetrical shapes with respect to the folding axis A. However, the first rear surface cover 380 and the second rear surface cover 390 do not necessarily have mutually symmetrical shapes, and in another embodiment of the disclosure, the electronic device 101 may include the first rear surface cover 380 and the second rear surface cover 390 of various shapes. In still another embodiment of the disclosure, the first rear surface cover 380 may be integrally formed with the first housing structure 310, and the second rear surface cover 390 may be integrally formed with the second housing structure 320.

In an embodiment of the disclosure, the first rear surface cover 380, the second rear surface cover 390, the first housing structure 310, and the second housing structure 320 may form a space in which various components of the electronic device 101 (e.g., a printed circuit board, or a battery) may be disposed. In an embodiment of the disclosure, one or more components may be disposed or visually exposed on the rear surface of the electronic device 101. For example, at least a portion of a sub-display 290 may be visually exposed through a first rear surface area 382 of the first rear surface cover 380. In another embodiment of the disclosure, one or more components or sensors may be visually exposed through a second rear surface area 392 of the second rear surface cover 390. In various embodiments of the disclosure, the sensors may include an ambient light sensor, a proximity sensor, and/or a rear surface camera.

The hinged cover 330, disposed between the first housing structure 310 and the second housing structure 320, may be constituted to conceal internal components (e.g., a hinged structure). In an embodiment of the disclosure, the hinged cover 330 may be covered by portions of the first housing structure 310 and the second housing structure 320, or may be exposed to the outside, depending on the state of the electronic device 101 (a flat state or a folded state).

In an embodiment of the disclosure, in case that the electronic device 101 is in the flat state as illustrated in FIG. 2, the hinged cover 330 may be covered by the first housing structure 310 and the second housing structure 320 and may not be exposed. In an embodiment of the disclosure, in case that the electronic device 101 is in the folded state (e.g., a fully folded state), as illustrated in FIG. 3, the hinged cover 330 may be exposed to the outside between the first housing structure 310 and the second housing structure 320. In an embodiment of the disclosure, in case of the intermediate state in which the first housing structure 310 and the second housing structure 320 are folded with a predetermined angle, the hinged cover 330 may be partially exposed to the outside between the first housing structure 310 and the second housing structure 320. However, in this case, the exposed area may be less than the fully folded state. In an embodiment of the disclosure, the hinged cover 330 may include a curved surface.

The display 200 may be disposed in a space formed by the housing 300. For example, the display 200 rests in a recess formed by the housing 300, which may constitute most of the front surface of the electronic device 101.

Therefore, the front surface of the electronic device 101 may include the display 200 and a partial area of the first housing structure 310 and a partial area of the second housing structure 320 that are adjacent to the display 200. Further, the rear surface of the electronic device 101 may include the first rear surface cover 380, a partial area of the first housing structure 310 adjacent to the first rear surface cover 380, the second rear surface cover 390, and a partial area of the second housing structure 320 adjacent to the second rear surface cover 390.

The display 200 may mean a display having at least partial area that may be deformed into a flat surface or a curved surface. In an embodiment of the disclosure, the display 200 may include the folding area 203, a first area 201 disposed on one side (the left side of the folding area 203 illustrated in FIG. 3) and a second area 202 disposed on the other side (the right side of the folding area 203 illustrated in FIG. 3) with respect to the folding area 203.

In an embodiment of the disclosure, the display 200 may include a top emission type of OLED display or a bottom emission type of OLED display. The OLED display may include a low temperature color filter (LTCF) layer, a window glass (e.g., an ultra-thin glass (UTG) or polymer window), and an optical compensation film (e.g., an optical compensation film (OCF)). Here, a polarizing film (or polarizing layer) may be replaced by the LTCF layer of the OLED display.

The division of the area of the display 200 is for illustrative purposes only, and the display 200 may be divided into a plurality of areas (e.g., four or more or two) based on structures or functions of the display 200. In an embodiment of the disclosure, the area of the display 200 may be divided by the folding area 203 extending parallel to the y-axis or by the folding axis A, but in another embodiment of the disclosure, the area of the display 200 may be divided by another folding area (e.g., a folding area parallel to the x-axis) or by another folding axis (e.g., a folding axis parallel to the x-axis).

The first area 201 and the second area 202 may have an overall symmetrical shape with respect to the folding area 203. However, unlike the first area 201, the second area 202 may include a notch that is cut depending on the presence of the sensor area 324, but may have a shape that is symmetrical to the first area 201 in other areas. In other words, the first area 201 and the second area 202 may include portions that have symmetrical shapes with respect to each other and portions that have asymmetrical shapes with respect to each other.

Hereinafter, operations of the first housing structure 310 and the second housing structure 320 and respective areas of the display 200 according to the state of the electronic device 101 (e.g., a flat state and a folded state) will be described.

In an embodiment of the disclosure, in case that the electronic device 101 is in the flat state (e.g., FIG. 2), the first housing structure 310 and the second housing structure 320 may be disposed to form an angle of 180 degrees and face the same direction. A surface of the first area 201 and a surface of the second area 202 of the display 200 form 180 degrees to each other and may face the same direction (e.g., a direction of the front surface of the electronic device). The folding area 203 may form the same plane as the first area 201 and the second area 202.

In an embodiment of the disclosure, in case that the electronic device 101 is in the folded state (e.g., FIG. 3), the first housing structure 310 and the second housing structure 320 may be disposed facing each other. The surface of the first area 201 and the surface of the second area 202 of the display 200 form a narrow angle (e.g., between 0 and 10 degrees) with each other, and may face each other. The folding area 203 may have at least a portion formed of a curved surface having a predetermined curvature.

In an embodiment of the disclosure, in case that the electronic device 101 is in a half-folded state, the first housing structure 310 and the second housing structure 320 may be disposed at a predetermined angle to each other. The surface of the first area 201 and the surface of the second area 202 of the display 200 may form an angle that is larger than the folded state and smaller than the flat state. The folding area 203 may have at least a portion formed of a curved surface having a predetermined curvature, in which case the curvature may be smaller than that in the folded state.

Figure 5:
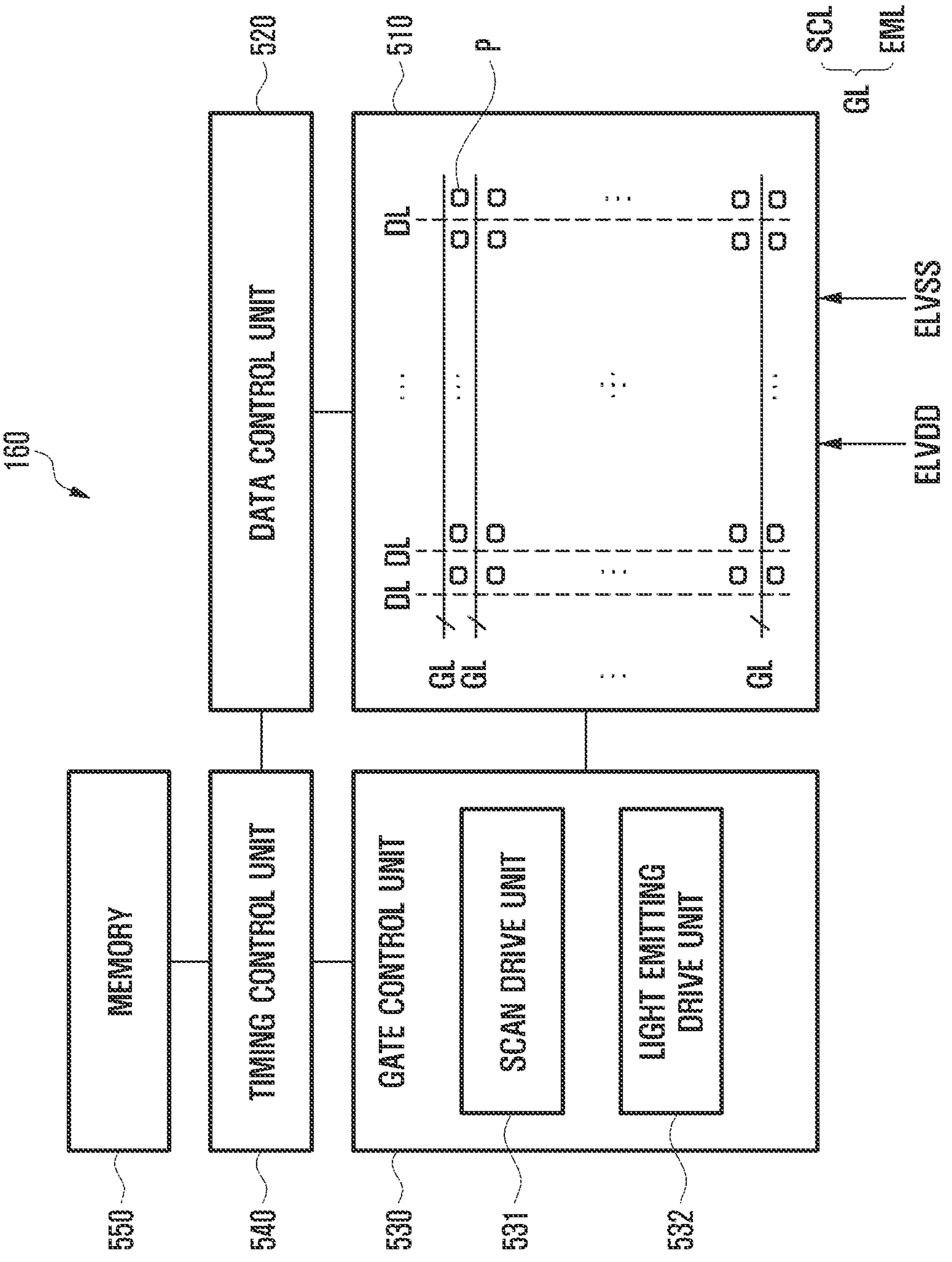
FIG. 5 is a block diagram of a display module according to an embodiment of the disclosure.

FIG. 5 is a block diagram of a display module according to an embodiment of the disclosure.

The display module 160 illustrated in FIG. 5 may be at least partially similar to the display module 160 illustrated in FIGS. 1 and/or 2, or may include other embodiments.

Referring to FIG. 5, the display module 160, according to an embodiment of the disclosure, may include a display panel 510, a data control unit 520, a gate control unit 530, a timing control unit 540, and/or a memory 550 (e.g., dynamic random access memory (DRAM)).

According to various embodiments of the disclosure, at least a portion of the data control unit 520, the gate control unit 530, the timing control unit 540, and/or the memory 550 (e.g., dynamic random access memory (DRAM)) may be disposed in the DDI (e.g., the DDI 230 in FIG. 2).

According to an embodiment of the disclosure, the data control unit 520, the timing control unit 540, and/or the memory 550 (e.g., dynamic random access memory (DRAM)) may be disposed in the DDI 230 (e.g., the DDI 230 in FIG. 2). The gate control unit 530 may be disposed in a non-display area (e.g., a bezel area) of the display panel 510.

According to an embodiment of the disclosure, the display panel 510 may include a plurality of gate lines GL and a plurality of data lines DL. According to an embodiment of the disclosure, the plurality of gate lines GL may be formed in a first direction (e.g., a horizontal direction in FIG. 5) and disposed at specified intervals.

According to an embodiment of the disclosure, the plurality of data lines DL may be formed, for example, in a second direction perpendicular to the first direction (e.g., a vertical direction in FIG. 5) and disposed at specified intervals.

In various embodiments of the disclosure, the "a scanning direction of the display panel 510" may be defined as the vertical direction in which the gate lines GL are formed (e.g., the horizontal direction in FIG. 5). For example, in case that the plurality of gate lines GL are formed in the first direction (e.g., the horizontal direction in FIG. 5), the scanning direction of the display panel 510 may be defined as being in the second direction (e.g., the vertical direction in FIG. 5) perpendicular to the first direction.

According to an embodiment of the disclosure, a pixel P may be disposed in each of partial areas of the display panel 510 where the plurality of gate lines GL and the plurality of data lines DL intersect each other. According to an embodiment of the disclosure, each pixel P is electrically connected to the gate line GL and the data line DL to display a specified gradation.

According to an embodiment of the disclosure, each pixel P may receive a gate scan signal and a light emission signal through the gate line GL, and a data signal through the data line DL. According to an embodiment of the disclosure, each pixel P may receive a high potential voltage (e.g., electroluminescent voltage device (ELVDD) voltage) and a low potential voltage (e.g., ELVSS voltage) as a power source for driving an organic light emitting diode (OLED).

According to an embodiment of the disclosure, each pixel P may include an OLED and a pixel drive circuit (not illustrated) for driving the OLED.

According to an embodiment of the disclosure, the pixel drive circuit disposed in each pixel P may control to turn the OLED on (e.g., in an activation state) or off (e.g., in a deactivation state) based on the gate scan signal and the light emission signal.

According to an embodiment of the disclosure, when the OLED of each pixel P is in an on state (e.g., an activation state), the OLED may display a gradation (e.g., luminance) corresponding to the data signal for a period of one frame.

According to an embodiment of the disclosure, the data control unit 520 may drive the plurality of data lines DL. According to an embodiment of the disclosure, the data control unit 520 may receive at least one synchronization signal, and a data signal (e.g., digital image data) from the timing control unit 540 or the processor (e.g., the processor 120 in FIG. 1). According to an embodiment of the disclosure, the data control unit 520 may determine a data voltage (e.g., analog image data) corresponding to an input data signal using a reference gamma voltage and a specified gamma curve. According to an embodiment of the disclosure, the data control unit 520 may supply the data voltage to each pixel P by applying the data voltage to the plurality of data lines DL.

According to an embodiment of the disclosure, the data control unit 520 may receive a plurality of synchronization signals having the same frequencies or different frequencies from the timing control unit 540 or the processor 120 (e.g., the processor 120 in FIG. 1).

According to an embodiment of the disclosure, the processor 120 may independently control a first driving frequency (e.g., 120 Hz) of an execution screen of a first application displayed through a first portion (e.g., the first area 201 in FIG. 3) and a second driving frequency (e.g., 60 Hz) of an execution screen of a second application displayed through a second portion (e.g., the second area 202 in FIG. 3).

According to an embodiment of the disclosure, the gate control unit 530 may drive the plurality of gate lines GL. According to an embodiment of the disclosure, the gate control unit 530 may receive at least one synchronization signal from the timing control unit 540 or the processor 120 (e.g., the processor 120 in FIG. 1).

According to an embodiment of the disclosure, the gate control unit 530 may include a scan drive unit 531 (e.g., a gate drive unit) that sequentially generates a plurality of gate scan signals based on the synchronization signal, and supplies the generated plurality of gate scan signals to the gate line GL.

According to an embodiment of the disclosure, the gate control unit 530 may include a light emitting drive unit 532 that sequentially generates a plurality of light emitting signals based on the synchronization signal, and supplies the generated plurality of light emitting signals to the gate line GL.

For example, each gate line GL may include a gate signal line (SCL) (e.g., scan signal line) to which a gate scan signal is applied, and/or an emission signal line (EML) to which an emission signal is applied.

According to an embodiment of the disclosure, the gate control unit 530 may receive a same frequency synchronization signal from the timing control unit 540 or the processor 120 (e.g., the processor 120 in FIG. 1). In an embodiment of the disclosure, the gate control unit 530 may apply a gate scan signal and/or a light emitting signal corresponding to the first drive frequency (e.g., 120 hertz (Hz)) to some of the gate lines GL corresponding to the first portion (e.g., the first area 201 in FIG. 3) of the plurality of gate lines GL. In addition, a gate scan signal and/or a light emitting signal corresponding to the first drive frequency (e.g., 120 Hz) may be applied to some of the gate lines GL corresponding to the second portion (e.g., the second area 202 in FIG. 3) of the plurality of gate lines GL.

In another embodiment of the disclosure, the gate control unit 530 may receive a plurality of synchronization signals having different frequencies from the timing control unit 540 or the processor 120 (e.g., the processor 120 in FIG. 1). In an embodiment of the disclosure, the gate control unit 530 may apply a gate scan signal and/or a light emitting signal corresponding to the first drive frequency (e.g., 120 Hz) to some of the gate lines GL corresponding to the first portion (e.g., the first area 201 in FIG. 3) of the plurality of gate lines GL. In addition, a gate scan signal and/or a light emitting signal corresponding to the second drive frequency (e.g., 60 Hz) may be applied to some of the gate lines GL corresponding to the second portion (e.g., the second area 202 in FIG. 3) of the plurality of gate lines GL.

According to an embodiment of the disclosure, the timing control unit 540 may control a drive timing of the gate control unit 530 and the data control unit 520. According to an embodiment of the disclosure, the timing control unit 540 may obtain a data signal (e.g., digital image data) of one frame. According to an embodiment of the disclosure, the timing control unit 540 may receive a data signal of one frame from the processor 120. According to an embodiment of the disclosure, the timing control unit 540 may refer to the memory 550 (e.g., DRAM) storing a data signal of a previous frame to control at least a portion of the display panel 510 to display an image of the previous frame, based on a specified event.

According to an embodiment of the disclosure, the timing control unit 540 may convert the obtained data signal (e.g., digital image data) to correspond to a resolution of the display panel 510, and supply the converted data signal to the data control unit 520.

Figure 6:
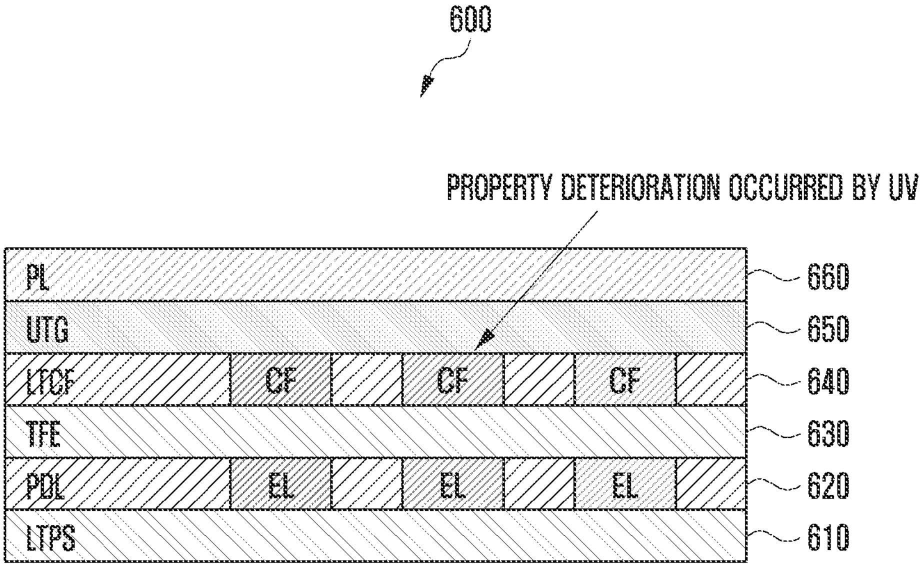
FIG. 6 is a view illustrating that a low temperature color filter (LTCF) of a display (e.g., an OLED display) is deteriorated by ultraviolet rays UV according to an embodiment of the disclosure.

FIG. 6 is a view illustrating that a low temperature color filter (LTCF) of a display (e.g., an OLED display) is deteriorated by ultraviolet rays UV according to an embodiment of the disclosure.

Referring to FIG. 6, an OLED display 600 may include a substrate 610, an organic layer 620, an encapsulation layer 630, an LTCF layer 640, a glass layer 650, and a protective layer 660.

In an embodiment of the disclosure, the substrate 610 may be applied with a low temperature polycrystalline silicon (LTPS) substrate. In an embodiment of the disclosure, the organic layer 620 may include a plurality of organic light emitting elements EL. In an embodiment of the disclosure, the encapsulation layer 630 may be applied with a thin film encapsulation (TFE) layer. In an embodiment of the disclosure, the LTCF layer 640 may include color filters of red, green, and blue corresponding to a color of each pixel. In an embodiment of the disclosure, the glass layer 650 may include an ultra thin glass (UTG). In an embodiment of the disclosure, the protective layer 660 may include a polymer layer (e.g., polyethylene terephthalate (PET)) or polyimide. The polymer layer (e.g., polyethylene terephthalate (PET)) may be laminated with the glass layer 650. In an embodiment of the disclosure, the protective layer 660 may protect other layers included in the OLED display 600 from external impact. For example, the protective layer 660 may protect the glass layer 650 and prevent shattering in case of a crack in the glass layer 650. The protective layer 660 may include a glass material, or may be constituted by a film layer or coating layer. The protective layer 660 may include a flexible material. The protective layer 660 may be formed of a transparent material having high light transmittance.

When the OLED display 600 is exposed to external light, the plurality of LTCFs in the LTCF layer 640 may be deteriorated by ultraviolet rays UV. Here, the LTCFs may be deteriorated by light at wavelengths between 380 nm and 400 nm. Each of the pixels in which the LTCFs have deteriorated may experience color distortion, and the transmittance of the LTCF layer 640 may gradually degrade in proportion to time exposed to ultraviolet rays UV. More particularly, when only the LTCFs of some pixels are deteriorated, the transmittance of a specific pixel decreases. In addition, differences in the degree of deterioration of the LTCFs of pixels will result in a deviation in the transmittance between the pixels. In this case, the difference in transmittance between each pixel may cause color deviation. In addition, since organic materials contained in each color of the red, green, and blue pixels are different, differences in the deterioration caused by ultraviolet rays UV may be caused by differences in the properties of the organic materials. The color deviation may be caused by a deviation in the deterioration of each organic material in the red, green, and blue pixels by ultraviolet rays UV.

Since the deterioration of the LTCFs may reduce the display quality of the electronic device, the electronic device of the disclosure (e.g., the electronic device 101 in FIG. 1) may determine the deterioration of the LTCFs by ultraviolet rays UV and compensate for data in each pixel.

Figure 7:
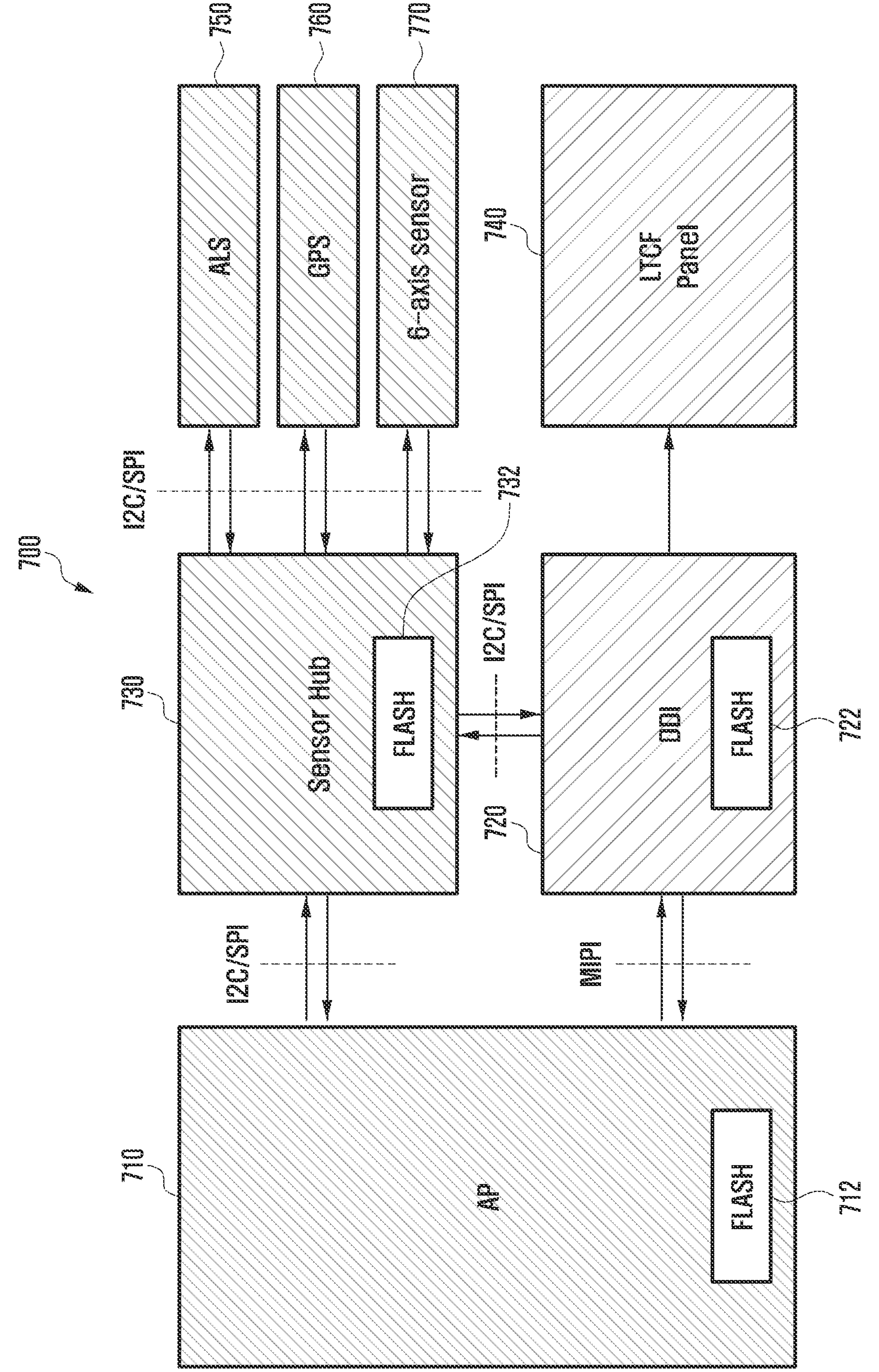
FIG. 7 is a block diagram of an electronic device according to an embodiment of the disclosure.

FIG. 7 is a block diagram of an electronic device according to an embodiment of the disclosure.

Referring to FIG. 7, an electronic device 700 according to various embodiments of the disclosure may include a processor 710 (e.g., an application processor) (e.g., the processor 120 in FIG. 1), a DDI 720 (e.g., the DDI 230 in FIG. 2), a sensor hub 730, an OLED display 740 (e.g., the OLED display 600 in FIG. 6), one or more ambient light sensors (ALS) 750 (e.g., an optical sensor), a position sensor 760 (e.g., a global positioning system (GPS)), and a posture sensor 770 (e.g., a six-axis sensor) (e.g., a gesture sensor, a gyro sensor, a barometric pressure sensor, and/or an acceleration sensor).

In an embodiment of the disclosure, the electronic device 700 according to various embodiments of the disclosure may compensate for degradation of an LTCF (e.g., the LTCF of FIG. 6) by ultraviolet rays UV using one or more ambient light sensors 750.

In an embodiment of the disclosure, the one or more ambient light sensors 750 may measure the degree to which LTCFs (e.g., the LTCF layer 640 in FIG. 6) are exposed to ultraviolet rays UV in response to external light exposure of the OLED display 740. The one or more ambient light sensors 750 may provide measured value of exposure to ultraviolet rays UV to the sensor hub 730.

In an embodiment of the disclosure, the one or more ambient light sensors 750 may be disposed on a lower portion of the OLED display 740 or on a bezel of the electronic device 700.

In an embodiment of the disclosure, the electronic device 700 may use the position sensor 760 (e.g., a global positioning system (GPS)), and the posture sensor 770 (e.g., a six-axis sensor) (e.g., a gesture sensor, a gyro sensor, a barometric pressure sensor, and/or an accelerometer sensor) to improve accuracy in measuring a wavelength component and intensity of UV incident on the OLED display 740.

In an embodiment of the disclosure, the position sensor 760 (e.g., a global positioning system (GPS)) may measure a position of the electronic device 700 and provide the measured position data of the electronic device 700 to the sensor hub 730.

In an embodiment of the disclosure, the posture sensor 770 (e.g., a six-axis sensor) (e.g., a gesture sensor, a gyro sensor, a barometric pressure sensor, and/or an accelerometer sensor) may measure posture of the electronic device 700 and provide posture data of the electronic device 700 to the sensor hub 730.

In an embodiment of the disclosure, the sensor hub 730 may include a memory 732 (e.g., a flash memory), and may store the value of exposure to ultraviolet rays UV, the position data of the electronic device 700, and the posture data of the electronic device 700 in the memory 732 (e.g., a flash memory).

In an embodiment of the disclosure, the sensor hub 730 may provide the value of exposure to ultraviolet rays UV input from the one or more ambient light sensors 750 to the processor 710 (e.g., an application processor) and the DDI 720. In addition, the sensor hub 730 may provide the position data of the electronic device 700 input from the position sensor 760 (e.g., a global positioning system (GPS)) to the processor 710 (e.g., an application processor) and the DDI 720. In addition, the sensor hub 730 may provide the processor 710 (e.g., the application processor) and the DDI 720 with the posture data of the electronic device 700 input from the posture sensor 770 (e.g., a six-axis sensor) (e.g., a gesture sensor, a gyro sensor, a barometric pressure sensor, and/or an accelerometer sensor).

In an embodiment of the disclosure, the processor 710 (e.g., an application processor) may include a memory 712 (e.g., a flash memory), and may store the value of exposure to ultraviolet rays UV in the memory 712 (e.g., a flash memory). In addition, the processor 710 (e.g., an application processor) may store the position data of the electronic device 700 in the memory 712 (e.g., a flash memory). In addition, the processor 710 (e.g., an application processor) may store the posture data of the electronic device 700 in the memory 712 (e.g., a flash memory). In addition, the processor 710 may store a compensation value lookup table (LUT) in the memory 712 (e.g., a flash memory) in which values of the degree of deterioration of the LTCFs (e.g., the LTCF layer 640 in FIG. 6) are listed according to the cumulative amount of ultraviolet rays UV irradiated on the OLED display 740.

In an embodiment of the disclosure, the DDI 720 may include a memory 722 (e.g., a flash memory and may store the value of exposure to ultraviolet rays UV in the memory 722 (e.g., a flash memory). In addition, the DDI 720 may store the position data of the electronic device 700 in the memory 722 (e.g., a flash memory). In addition, the DDI 720 may store the posture data of the electronic device 700 in the memory 722 (e.g., a flash memory). In addition, the DDI 720 may store a compensation value lookup table (LUT) in the memory 722 (e.g., a flash memory) in which values of the degree of deterioration of the LTCFs (e.g., the LTCF layer 640 in FIG. 6) are listed according to the cumulative amount of ultraviolet rays UV irradiated on the OLED display 740.

Figure 8:
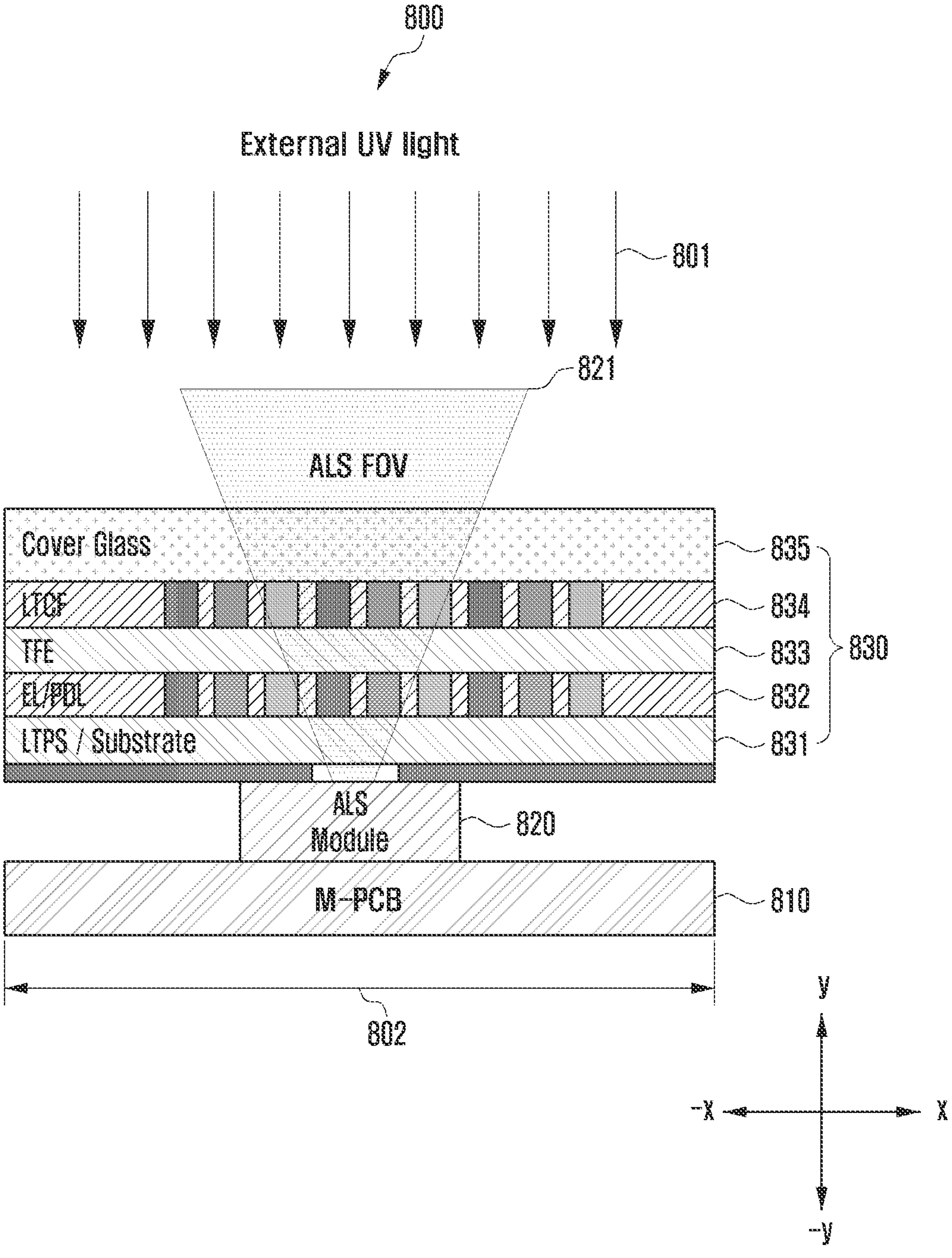
FIG. 8 is a view illustrating an electronic device according to an embodiment of the disclosure.

FIG. 8 is a view of an electronic device according to an embodiment of the disclosure.

Referring to FIG. 8, an electronic device 800 according to various embodiments of the disclosure may include a printed circuit board (PCB) 810 (e.g., a main printed circuit board), an ambient light sensor module 820, and an OLED display 830 (e.g., the OLED display 600 in FIG. 6, or the OLED display 740 in FIG. 7).

In an embodiment of the disclosure, the OLED display 830 (e.g., the OLED display 600 in FIG. 6, or the OLED display 740 in FIG. 7) may include a substrate 831 (e.g., the substrate 610 in FIG. 6), an organic layer 832 (e.g., the organic layer 620 in FIG. 6), an encapsulation layer 833 (e.g., the encapsulation layer 630 in FIG. 6), an LTCF layer 834 (e.g., the LTCF layer 640 in FIG. 6), a cover glass 835 (e.g., the glass layer 650 in FIG. 6, and the protective layer 660 in FIG. 6).

In an embodiment of the disclosure, the ambient light sensor module 820 may include one or plurality of ambient light sensors (e.g., the ambient light sensor 750 in FIG. 7) and a drive circuit to drive the one or plurality of ambient light sensors (e.g., the ambient light sensor 750 in FIG. 7).

In an embodiment of the disclosure, the ambient light sensor module 820 may be disposed at a lower portion of the OLED display 830 (e.g., in the −y-axis direction). For example, the one or plurality of ambient light sensors (e.g., the ambient light sensor 750 in FIG. 7) may be disposed at the lower portion of the OLED display 830 (e.g., in the −y-axis direction).

In an embodiment of the disclosure, the ambient light sensor module 820 may be disposed to at least partially overlap an active area 802 (e.g., an area where pixels are disposed) of the OLED display 830.

In an embodiment of the disclosure, the ambient light sensor module 820 may be disposed on an upper portion of the printed circuit board (PCB) 810 (e.g., a main printed circuit board). The ambient light sensor module 820 and the printed circuit board (PCB) 810 (e.g., a main printed circuit board) may be electrically connected.

In an embodiment of the disclosure, directions of a light emission central axis of the OLED display 830 and an illuminance measurement central axis 821 of the one or plurality of ambient light sensors (e.g., the ambient light sensor 750 in FIG. 7) may match each other.

In an embodiment of the disclosure, the intensity and cumulative amount of ultraviolet rays 801 incident on each pixel of the OLED display 830 may be measured using the one or plurality of ambient light sensors (e.g., the ambient light sensor 750 of FIG. 7) disposed at the lower portion of the OLED display 830 (e.g., in the −y-axis direction).

In an embodiment of the disclosure, the one or plurality of ambient light sensors (e.g., the ambient light sensor 750 in FIG. 7) may generate values of exposure to ultraviolet rays 801 for a plurality of LTCFs disposed in the LTCF layer 834 and provide the values of exposure to ultraviolet rays 801 to the sensor hub (e.g., the sensor hub 730 in FIG. 7). For example, the values of exposure to ultraviolet rays 801 may be generated in common for all LTCFs. For example, the value of exposure to ultraviolet rays 801 may be generated for each of the LTCFs corresponding to each pixel.

Figure 9:
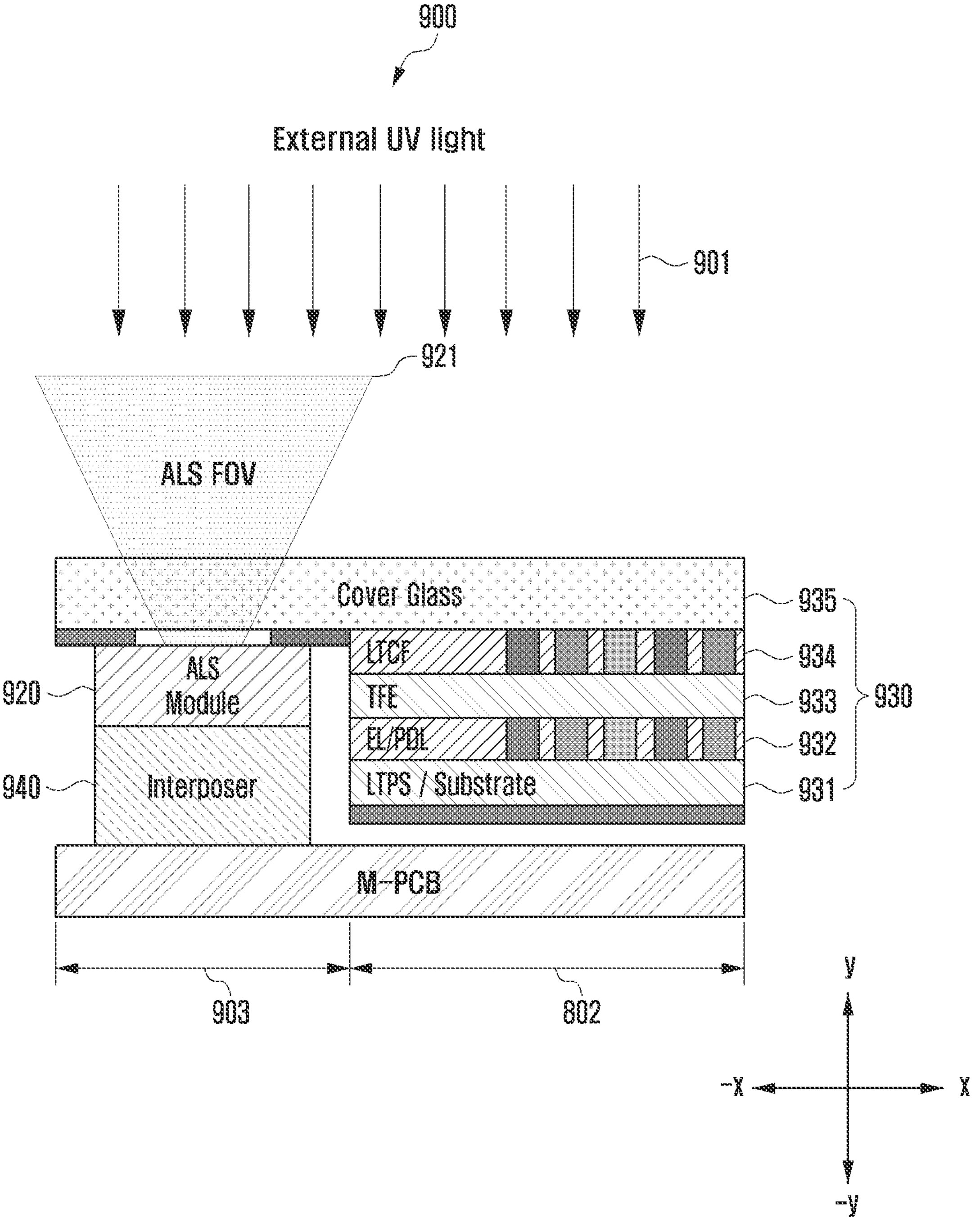
FIG. 9 is a view illustrating an electronic device according to an embodiment of the disclosure.

FIG. 9 is a view of an electronic device according to an embodiment of the disclosure.

Referring to FIG. 9, an electronic device 900 according to various embodiments of the disclosure may include a printed circuit board (PCB) 910 (e.g., a main printed circuit board), an ambient light sensor module 920, an OLED display 930 (e.g., the OLED display 600 in FIG. 6, or the OLED display 740 in FIG. 7), and an interposer 940.

In an embodiment of the disclosure, the OLED display 930 (e.g., the OLED display 600 in FIG. 6, or the OLED display 740 in FIG. 7) may include a substrate 931 (e.g., the substrate 610 in FIG. 6), an organic layer 932 (e.g., the organic layer 620 in FIG. 6), an encapsulation layer 933 (e.g., the encapsulation layer 630 in FIG. 6), an LTCF layer 934 (e.g., the LTCF layer 640 in FIG. 6), a cover glass 935 (e.g., the glass layer 650 in FIG. 6, and the protective layer 660 in FIG. 6).

In an embodiment of the disclosure, the ambient light sensor module 920 may include one or plurality of ambient light sensors (e.g., the ambient light sensor 750 in FIG. 7) and a drive circuit to drive the one or plurality of ambient light sensors (e.g., the ambient light sensor 750 in FIG. 7).

In an embodiment of the disclosure, the ambient light sensor module 920 may be disposed in a bezel area 903 (e.g., a non-display area) at a lower portion of the OLED display 930 (e.g., in the −y-axis direction). For example, one or plurality of ambient light sensors (e.g., the ambient light sensor 750 in FIG. 7) may be disposed in a bezel area 903 (e.g., a non-display area) that is positioned outside of the active area 802 of the OLED display 930.

In an embodiment of the disclosure, the ambient light sensor module 920 may be disposed to at least partially overlap the bezel area 903 (e.g., a non-display area) of the OLED display 930.

In an embodiment of the disclosure, the interposer 940 may be disposed on an upper portion of the printed circuit board (PCB) 910 (e.g., a main printed circuit board). The ambient light sensor module 920 may be disposed on the interposer 940. At least portions of the ambient light sensor module 920 and the interposer 940 may be disposed in the bezel area 903. The ambient light sensor module 920 and the printed circuit board (PCB) 910 (e.g., a main printed circuit board) may be electrically connected through the interposer 940.

In an embodiment of the disclosure, directions of a light emission central axis of the OLED display 930 and an illuminance measurement central axis 921 of the one or plurality of ambient light sensors (e.g., the ambient light sensor 750 in FIG. 7) may match each other.

In an embodiment of the disclosure, the intensity and cumulative amount of ultraviolet rays 901 incident on each pixel of the OLED display 930 may be measured using the one or plurality of ambient light sensors (e.g., the ambient light sensor 750 of FIG. 7) disposed at a lower portion the bezel area 903 of the electronic device 900 (e.g., in the −y-axis direction).

In an embodiment of the disclosure, the one or plurality of ambient light sensors (e.g., the ambient light sensor 750 in FIG. 7) may generate values of exposure to ultraviolet rays 901 for a plurality of LTCFs disposed in the LTCF layer 934 and provide the values of exposure to ultraviolet rays 901 to the sensor hub (e.g., the sensor hub 730 in FIG. 7). For example, the values of exposure to ultraviolet rays 901 may be generated in common for all LTCFs. For example, the value of exposure to ultraviolet rays 901 may be generated for each of the LTCFs corresponding to each pixel.

In the description with reference to FIG. 8, it was described that the ambient light sensor is disposed at the lower portion of the display. Further, In the description referring to FIG. 9, it was described that the ambient light sensor is disposed at the bezel area. However, the disclosure is not limited thereto, and the ambient light sensor may be disposed in the same plane as a plurality of pixels in the active area of the display.

Figure 10:
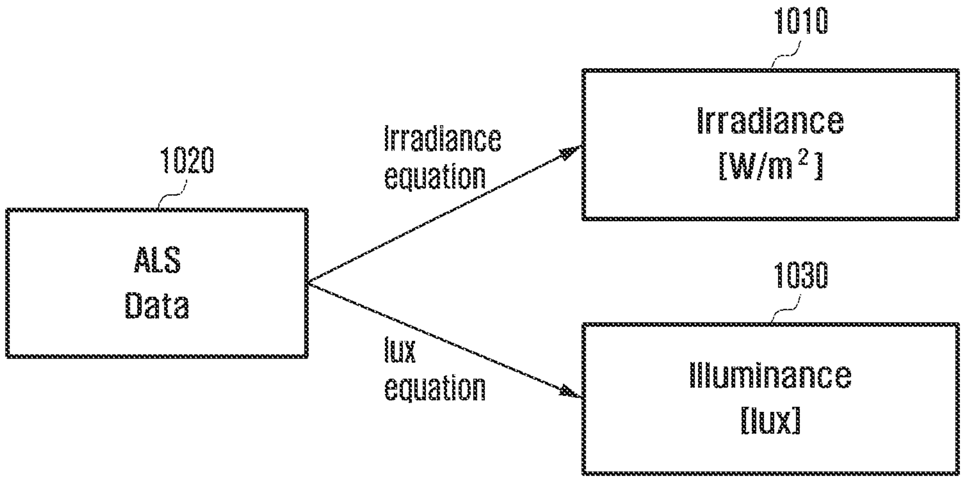
FIG. 10 is a view illustrating a method of calculating an irradiance value to compensate for deterioration of a low temperature color filter (LTCF) according to an embodiment of the disclosure.

FIG. 10 is a view illustrating a method of calculating an irradiance value to compensate for deterioration of a low temperature color filter (LTCF) according to an embodiment of the disclosure.

Referring to FIG. 10, since the deterioration of the LTCF is a physical deterioration caused by ultraviolet rays UV band light, the deterioration may be proportional to a radiant exposure value [J/m2] in radiometry unit.

In an embodiment of the disclosure, the processor (e.g., the processor 710 in FIG. 7) may obtain an irradiance value 1010 using one or plurality of ambient light sensors (e.g., the ambient light sensor 750 in FIG. 7). The processor (e.g., the processor 710 in FIG. 7) may calculate a radiant exposure value [J/m2] based on the irradiance value 1010.

In an embodiment of the disclosure, one or more ambient light sensors (e.g., the ambient light sensor 750 in FIG. 7) may be used to detect external light irradiated on the OLED display (e.g., the OLED display 740 in FIG. 7, the OLED display 830 in FIG. 8, or the OLED display 930 in FIG. 9).

In an embodiment of the disclosure, one or more ambient light sensors (e.g., the ambient light sensor 750 in FIG. 7) may generate values of exposure to ultraviolet rays 801 for a plurality of LTCFs disposed in the LTCF layer (e.g., the LTCF layer 834 in FIG. 8) based on the detected external light.

In an embodiment of the disclosure, an analog value of external light detected through one or plurality of ambient light sensors (e.g., ambient light sensor 750 in FIG. 7) may be converted to a digital value of exposure 1020 to ultraviolet rays 801 (e.g., ALS data) by passing through an analog-to-digital converter (ADC) of the ambient light sensor (e.g., the ambient light sensor 750 in FIG. 7). The value of exposure 1020 to ultraviolet rays 801 may be provided to the processor (e.g., the processor 710 in FIG. 7) and the DDI (e.g., the DDI 720 in FIG. 7) through the sensor hub (e.g., the sensor hub 730 in FIG. 7).

In an embodiment of the disclosure, the processor (e.g., the processor 710 in FIG. 7) may calculate a radiant exposure value [J/m2] by converting an illuminance (lux) value 1030 and multiplying an irradiance value 1010 by exposure time [s] using Equation 1 below.

$$\text{Radiant exposure } [J/m^2] = \text{Irradiance } [W/m^2] \times \text{Exposed time } [s] \qquad \text{Equation 1}$$

In an embodiment of the disclosure, a difference in the measured value of ultraviolet rays UV (FOV, transmittance effects by other optical layers) may occur depending on a disposition condition of one or plurality of ambient light sensors (e.g., the ambient light sensor 750 in FIG. 7) in the electronic device (e.g., the electronic device 700 in FIG. 7). The radiant exposure value [J/m2] calculated by the difference in the measured value of ultraviolet rays UV (FOV, transmittance effects by other optical layers) may vary. The processor (e.g., the processor 710 in FIG. 7) may use actual measured data from a disposition condition of the ambient light sensor module (e.g., the ambient light sensor module 820 in FIG. 8 or the ambient light sensor module 920 in FIG. 9), in order to reflect the difference in the measured value of ultraviolet rays UV (FOV, transmittance effects by other optical layers) depending on the disposition condition of one or plurality of ambient light sensors (e.g., the ambient light sensor 750 in FIG. 7).

In an embodiment of the disclosure, the processor (e.g., the processor 710 in FIG. 7) may use position data of the electronic device 700 measured from the position sensor (e.g., the position sensor 760 in FIG. 7) (e.g., a global positioning system (GPS)) to reflect variations in optical composition based on a region in which the electronic device (e.g., the electronic device 700 in FIG. 7) is located. The processor (e.g., the processor 710 of FIG. 7) may compensate for variations in composition of ultraviolet rays UV in a region in which the electronic device (e.g., the electronic device 700 of FIG. 7) is positioned based on position data of the electronic device 700.

For example, since there are differences in composition of ultraviolet rays UV included in external light between California and Seoul, the processor (e.g., the processor 710 of FIG. 7) may compensate for variations in the compositions of ultraviolet rays UV when the electronic device (e.g., the electronic device 700 of FIG. 7) is positioned in California and when the electronic device is positioned in Seoul. The processor (e.g., the processor 710 of FIG. 7) may differentially weight the measured value of ultraviolet rays UV of one or plurality of ambient light sensors (e.g., the ambient light sensor 750 in FIG. 7) based on position data of the electronic device (e.g., the electronic device 700 in FIG. 7).

Figure 11:
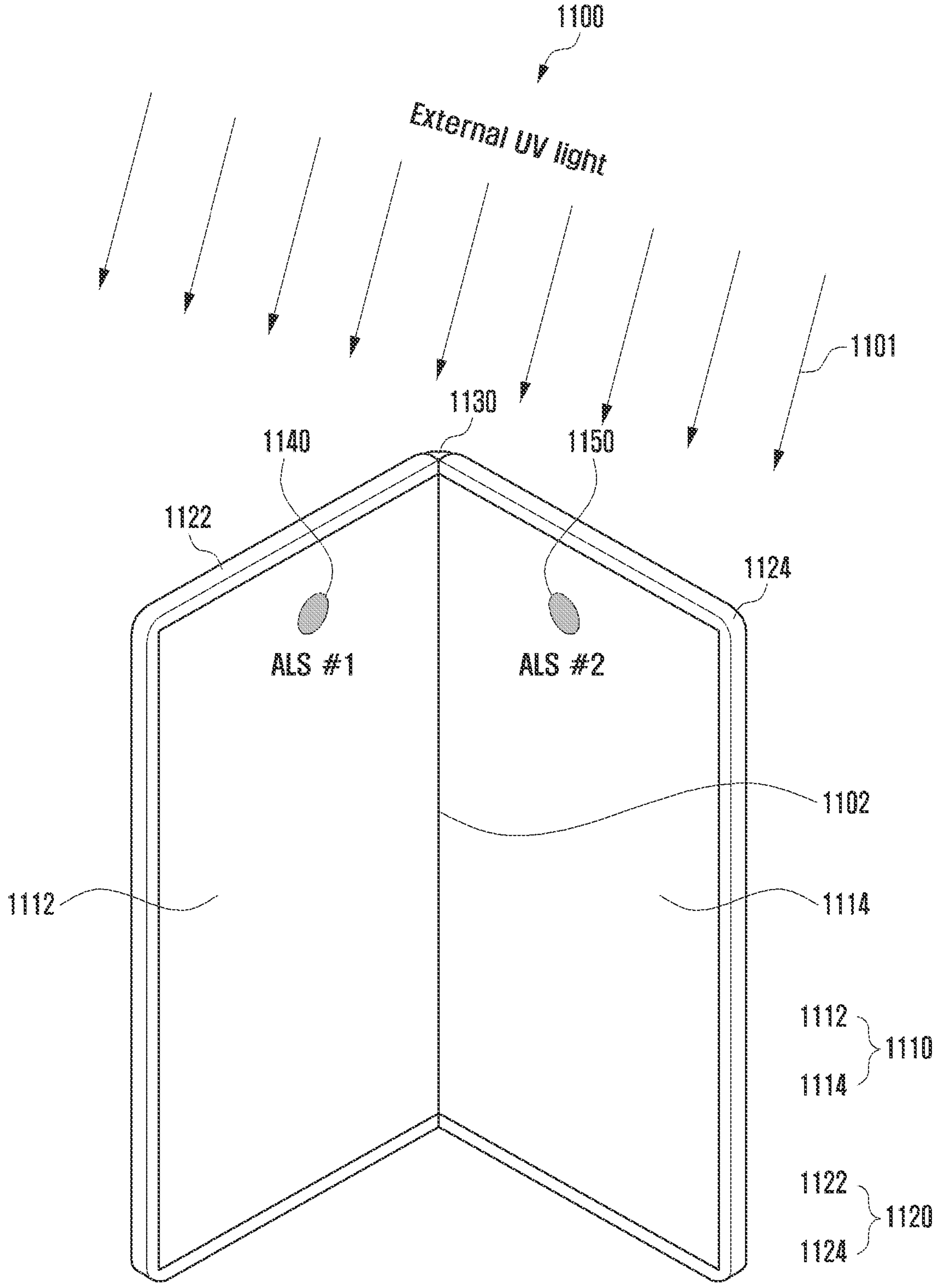
FIG. 11 is a view illustrating compensating for deterioration of a low temperature color filter (LTCF) by disposing an ambient light sensor (ALS) disposed on each of a plurality of display planes when an electronic device has the plurality of display planes, according to an embodiment of the disclosure.

FIG. 11 is a view illustrating compensating for deterioration of a low temperature color filter (LTCF) by disposing an ambient light sensor (ALS) disposed on each of a plurality of display planes when an electronic device has the plurality of display planes according to an embodiment of the disclosure.

Referring to FIG. 11, an electronic device 1100 according to various embodiments of the disclosure may include a display 1110 (e.g., the display 200 in FIGS. 2 and 3), a housing 1120 (e.g., the housing 300 in FIGS. 2 and 3), a hinged cover 1130 (e.g., the hinged cover 330 in FIGS. 2 and 3), a first ambient light sensor 1140, and a second ambient light sensor 1150. In addition, the electronic device 1100 according to various embodiments of the disclosure may include a position sensor (e.g., the position sensor 760 in FIG. 7) (e.g., a global positioning system (GPS)), and an posture sensor (e.g., the posture sensor 770 in FIG. 7) (e.g., a six-axis sensor) (e.g., a gesture sensor, a gyro sensor, a barometric pressure sensor, and/or an acceleration sensor).

In an embodiment of the disclosure, a display 1110 (e.g., the display 200 in FIGS. 2 and 3) may be disposed in a space formed by a housing 1120 (e.g., the housing 300 in FIGS. 2 and 3). The display 1110 (e.g., the display 200 in FIGS. 2 and 3) may be a flexible display or a foldable display.

In an embodiment of the disclosure, the housing 1120 (e.g., the housing 300 in FIGS. 2 and 3) may include a first housing structure 1122 (e.g., the first housing structure 310 in FIGS. 2 and 3), and a second housing structure 1124 (e.g., the second housing structure 320 in FIGS. 2 and 3).

In an embodiment of the disclosure, the display 1110 (e.g., the display 200 in FIGS. 2 and 3) rests in a recess formed by the housing 1120 (e.g., the housing 300 in FIGS. 2 and 3), which may constitute most of a front surface of the electronic device.

In an embodiment of the disclosure, the display 1110 (e.g., the display 200 in FIGS. 2 and 3) may include a top emission type or bottom emission type of OLED display. The OLED display may include a low temperature color filter (LTCF) layer, a window glass (e.g., an ultra-thin glass (UTG) or polymer window), and an optical compensation film (e.g., an optical compensation film (OCF)). Here, a polarizing film (or polarizing layer) may be replaced by the LTCF layer of the OLED display.

In an embodiment of the disclosure, the display 1110 (e.g., the display 200 in FIGS. 2 and 3) may include a first area 1112 disposed on one side (the left side of a folding area 1102 illustrated in FIG. 11) and a second area 1114 disposed on the other side (the right side of the folding area 1102 illustrated in FIG. 11) with respect to the folding area 1102.

In an embodiment of the disclosure, the first ambient light sensor 1140 may be disposed in a lower portion of the first area 1112 of the display 1110. Ultraviolet rays 1101 irradiated to the first area 1112 of the display 1110 may be measured using the first ambient light sensor 1140.

In an embodiment of the disclosure, the second ambient light sensor 1150 may be disposed in a lower portion of the second area 1114 of the display 1110. The amount of ultraviolet rays 1101 irradiated to the second area 1114 of the display 1110 may be measured using the second ambient light sensor 1150.

In an embodiment of the disclosure, an irradiance value (e.g., the irradiance value 1010 of FIG. 10) may vary in value depending on an angle that the plane of the OLED display 1110 forms with the external light. Therefore, the first ambient light sensor 1140 and the second ambient light sensor 1150 may be disposed to be corresponding to a first plane of the first area 1112 and a second plane of the second area 1114 of the display 1110, as the OLED display 1110 has a plurality of display planes (the first area 1112 and the second area 1114).

In an embodiment of the disclosure, a value of exposure to ultraviolet rays 1101 may be generated using the first ambient light sensor 1140 disposed in the first area 1112 of the display 1110 and the second ambient light sensor 1150 disposed in the second area 1114 of the display 1110. The processor (e.g., the processor 710 in FIG. 7) may calculate a radiant exposure value [J/m2] by multiplying an irradiance value by exposure time [s].

Figure 12:
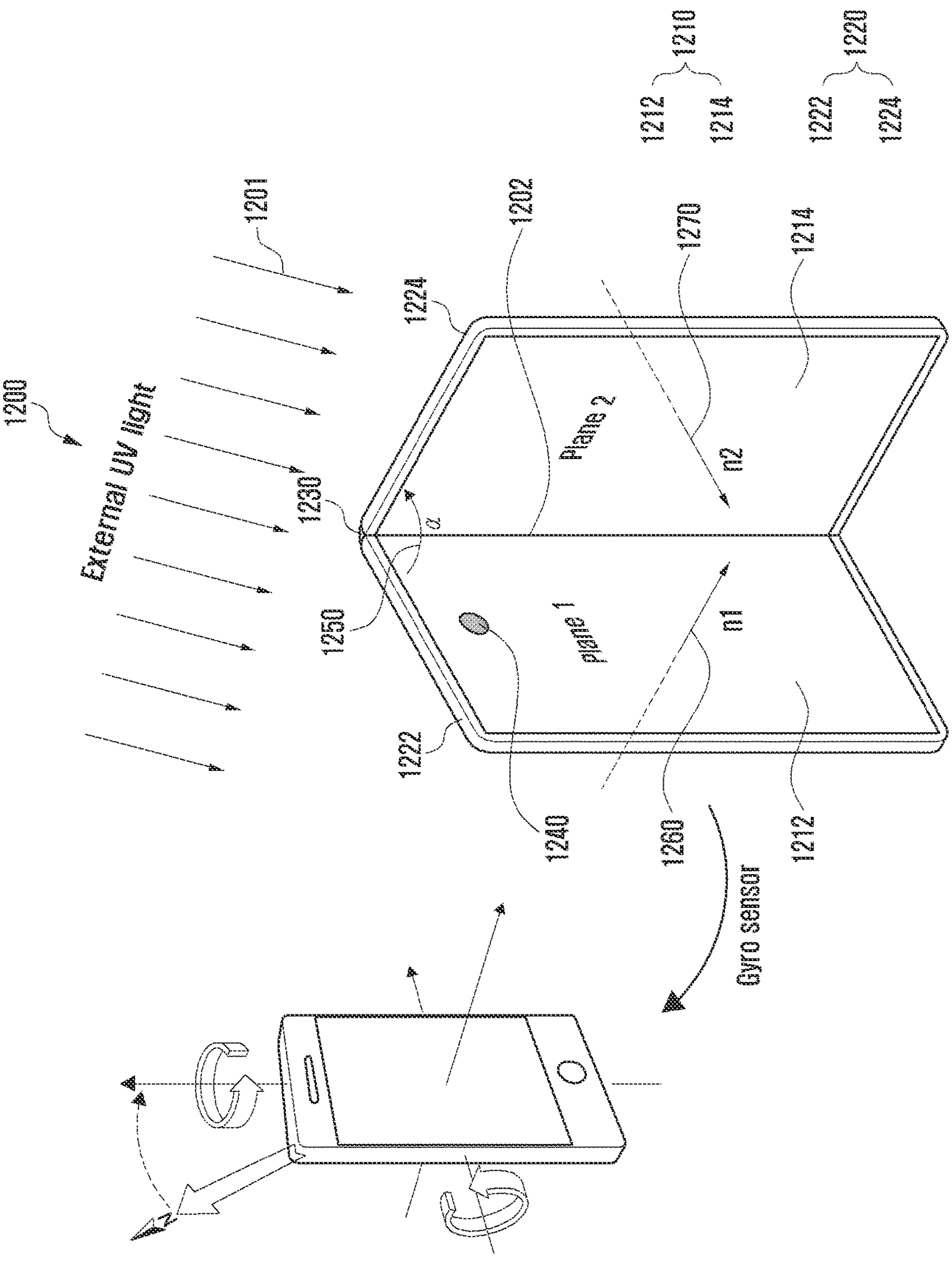
FIG. 12 is a view illustrating compensating for deterioration of a low temperature color filter (LTCF) by disposing one ambient light sensor (ALS) when an electronic device has a plurality of display planes, according to an embodiment of the disclosure.

FIG. 12 is a view illustrating compensating for deterioration of a low temperature color filter (LTCF) by disposing one ambient light sensor (ALS) when an electronic device has a plurality of display planes according to an embodiment of the disclosure.

Referring to FIG. 12, an electronic device 1200 according to various embodiments of the disclosure may include a display 1210 (e.g., the display 200 in FIGS. 2 and 3), a housing 1220 (e.g., the housing 300 in FIGS. 2 and 3), a hinged cover 1230 (e.g., the hinged cover 330 in FIGS. 2 and 3), and an ambient light sensor 1240. In addition, the electronic device 1200 according to various embodiments of the disclosure may include a position sensor (e.g., the position sensor 760 in FIG. 7) (e.g., a global positioning system (GPS)), and an posture sensor (e.g., the posture sensor 770 in FIG. 7) (e.g., a six-axis sensor) (e.g., a gesture sensor, a gyro sensor, a barometric pressure sensor, and/or an acceleration sensor).

In an embodiment of the disclosure, a display 1210 (e.g., the display 200 in FIGS. 2 and 3) may be disposed in a space formed by a housing 1220 (e.g., the housing 300 in FIGS. 2 and 3). The display 1210 (e.g., the display 200 in FIGS. 2 and 3) may be a flexible display or a foldable display.

In an embodiment of the disclosure, the housing 1220 (e.g., the housing 300 in FIGS. 2 and 3) may include a first housing structure 1222 (e.g., the first housing structure 310 in FIGS. 2 and 3), and a second housing structure 1224 (e.g., the second housing structure 320 in FIGS. 2 and 3).

In an embodiment of the disclosure, the display 1210 (e.g., the display 200 in FIGS. 2 and 3) rests in a recess formed by the housing 1220 (e.g., the housing 300 in FIGS. 2 and 3), which may constitute most of a front surface of the electronic device.

In an embodiment of the disclosure, the display 1210 (e.g., the display 200 in FIGS. 2 and 3) may include a top emission type or bottom emission type of OLED display. The OLED display may include a low temperature color filter (LTCF) layer, a window glass (e.g., an ultra-thin glass (UTG) or polymer window), and an optical compensation film (e.g., an optical compensation film (OCF)). Here, a polarizing film (or polarizing layer) may be replaced by the LTCF layer of the OLED display.

In an embodiment of the disclosure, the display 1210 (e.g., the display 200 in FIGS. 2 and 3) may include a first area 1212 disposed on one side (the left side of a folding area 1202 illustrated in FIG. 12) and a second area 1214 disposed on the other side (the right side of the folding area 1202 illustrated in FIG. 12) with respect to the folding area 1202.

In an embodiment of the disclosure, the ambient light sensor 1240 may be disposed in a lower portion of the first area 1212 of the display 1210. In case that the ambient light sensor 1240 is disposed at a lower portion of the first area 1212 of the display 1210, the ambient light sensor 1240 may measure the amount of ultraviolet rays 1201 irradiated on the first area 1212 of the display 1210 using the ambient light sensor 1240. For example, the processor (e.g., the processor 710 in FIG. 7) may calculate the amount of ultraviolet rays 1201 irradiated on the second area 1214 of the display 1210 based on a measurement result of ultraviolet rays 1201 irradiated on the first area 1212.

However, the disclosure is not limited thereto, and the ambient light sensor 1240 may be disposed at a lower portion of the second area 1214 of the display 1210. In case that the ambient light sensor 1240 is disposed at a lower portion of the second area 1214 of the display 1210, the ambient light sensor 1240 may measure ultraviolet rays 1201 irradiated on the second area 1214 of the display 1210 using the ambient light sensor 1240. For example, the processor (e.g., the processor 710 in FIG. 7) may calculate the amount of ultraviolet rays 1201 irradiated on the first area 1212 of the display 1210 based on a measurement result of the ultraviolet rays 1201 irradiated on the second area 1214.

In an embodiment of the disclosure, in case that the OLED display 1210 has a plurality of display planes (the first area 1212 and the second area 1214), the amount of ultraviolet rays 1201 irradiated on the plurality of display planes (the first area 1212 and the second area 1214) may be calculated using a single ambient light sensor 1240.

In an embodiment of the disclosure, in case that ambient light sensor 1240 is disposed in first area 1212 of display 1210, the processor (e.g., the processor 710 in FIG. 7) may calculate a radiant exposure value [J/m2] for the first plane (e.g., the first area 1212) by multiplying an irradiance value 1010 of the first plane (e.g., the first area 1212) by exposure time (s).

In addition, the processor (e.g., the processor 710 in FIG. 7) may calculate an irradiance value of the first plane (e.g., the first area 1212), an angle 1250 between the first plane (e.g., the first area 1212) and the second plane (e.g., the second area 1214), a first normal vector (1260, n1) in the first plane (e.g., the first area 1212) obtained using a gyro sensor (e.g., the posture sensor 770 in FIG. 7), a second normal vector (1270, n2) in the second plane (e.g., the second area 1214) obtained using the gyro sensor (e.g., the posture sensor 770 in FIG. 7), position data obtained using a position sensor (e.g., the position sensor 760 in FIG. 7); and a radiant exposure value [J/m2] of the second plane (e.g., the second area 1214) based on exposure time [s].

Figure 13:
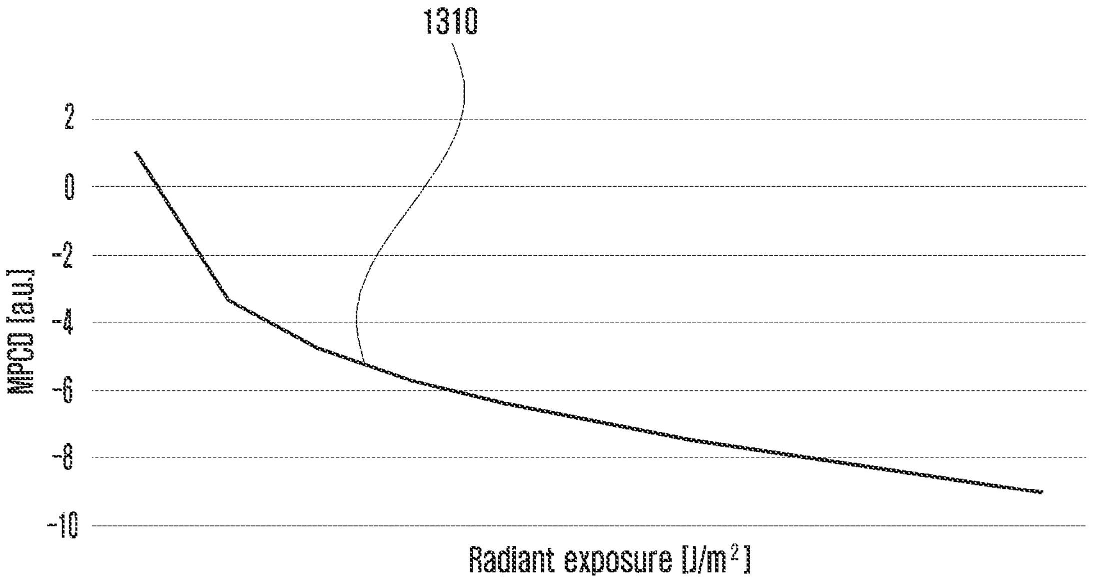
FIG. 13 is a view illustrating generating a compensation value lookup table (LUT) to compensate for color deviation according to radiant exposure based on time when an electronic device is exposed to external light according to an embodiment of the disclosure.

FIG. 13 is a view illustrating generating a compensation value lookup table (LUT) to compensate for color deviation according to radiant exposure based on time when an electronic device is exposed to external light according to an embodiment of the disclosure.

Referring to FIGS. 11, 12, and 13, in an embodiment of the disclosure, the processor (e.g., the processor 710 in FIG. 7) may input the obtained radiant exposure value [J/m2] of the first plane (e.g., the first area 1112 and 1212) into a compensation value lookup table (LUT) listing the amount of minimum perceptible color difference (MPCD) change 1310 based on the radiant exposure. The processor (e.g., processor 710 in FIG. 7) may perform color deviation compensation of pixels in the first area 1112 or 1212 of the display 1110 or 1120 when the amount of MPCD change 1310 is equal to or greater than a threshold value.

In an embodiment of the disclosure, the processor (e.g., the processor 710 in FIG. 7) may input the obtained radiant exposure value [J/m2] of the second plane (e.g., the second area 1114 or 1214) into a compensation value lookup table (LUT) listing the amount of MPCD change 1310 based on the radiant exposure. The processor (e.g., the processor 710 in FIG. 7) may perform color deviation compensation of pixels in the second area 1114 or 1214 of the display 1110 or 1120 when the amount of MPCD change 1310 is equal to or greater than a threshold value.

In an embodiment of the disclosure, upon compensating for color deviation of pixels in the first area 1112 or 1212 and second area 1114 or 1214 of the display 1110 or 1120, a gamma correction of each of the plurality of pixels may be performed to compensate for the color deviation.

In an embodiment of the disclosure, a compensation value lookup table (LUT) can be generated by an accelerated life test method that irradiates the electronic device with strong external light, as may vary depending on a stacking condition of each layer of the display 1110 or 1120 of the electronic device or an ambient light sensor.

In an embodiment of the disclosure, the compensation value lookup table (LUT) may be stored in the memory (e.g., the memory 712 in FIG. 7) of the processor (e.g., the processor 710 in FIG. 7) or in the memory (e.g., the memory 722 in FIG. 7) of the DDI (e.g., the DDI 720 in FIG. 7).

In an embodiment of the disclosure, color deviation compensation of pixels in the second area 1114 or 1214 of the display 1110 or 1120 may be performed by the processor (e.g., the processor 710 in FIG. 7) or by the DDI (e.g., the DDI 720 in FIG. 7).

For example, in case that the color deviation compensation of pixels in the second area 1114 or 1214 of the display 1110 or 1120 is performed by the processor (e.g., the processor 710 in FIG. 7), the processor (e.g., the processor 710 in FIG. 7) may apply a compensation value to an image data value of each pixel, and transmit the image data of each pixel with the compensation value applied to the DDI (e.g., the DDI 720 in FIG. 7).

For example, in case that the color deviation compensation of pixels in the second area 1114 or 1214 of the display 1110 or 1120 is performed in the DDI (e.g., the DDI 720 in FIG. 7), the processor (e.g., the processor 710 in FIG. 7) may transmit image data of each pixel to the DDI (e.g., the DDI 720 in FIG. 7) and apply a compensation value to the image data value of each pixel in the DDI (e.g., the DDI 720 in FIG. 7).

Figure 14:
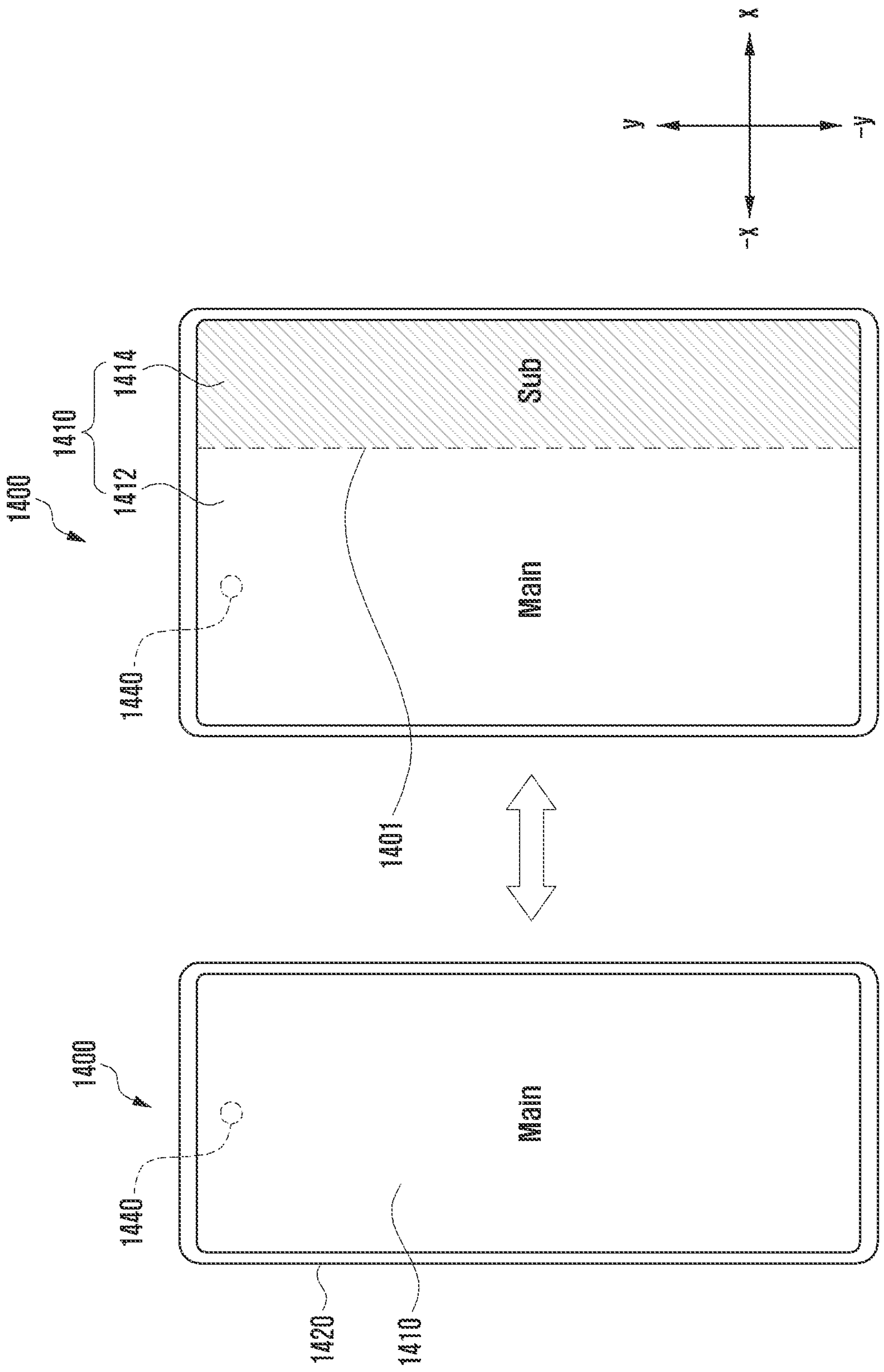
FIG. 14 is a view illustrating, when an electronic device includes a slidable display, a first area (e.g., a main area, a fixed area) and a second area (e.g., a sub-area, an expandable area) of the display according to an embodiment of the disclosure.
Figure 15:
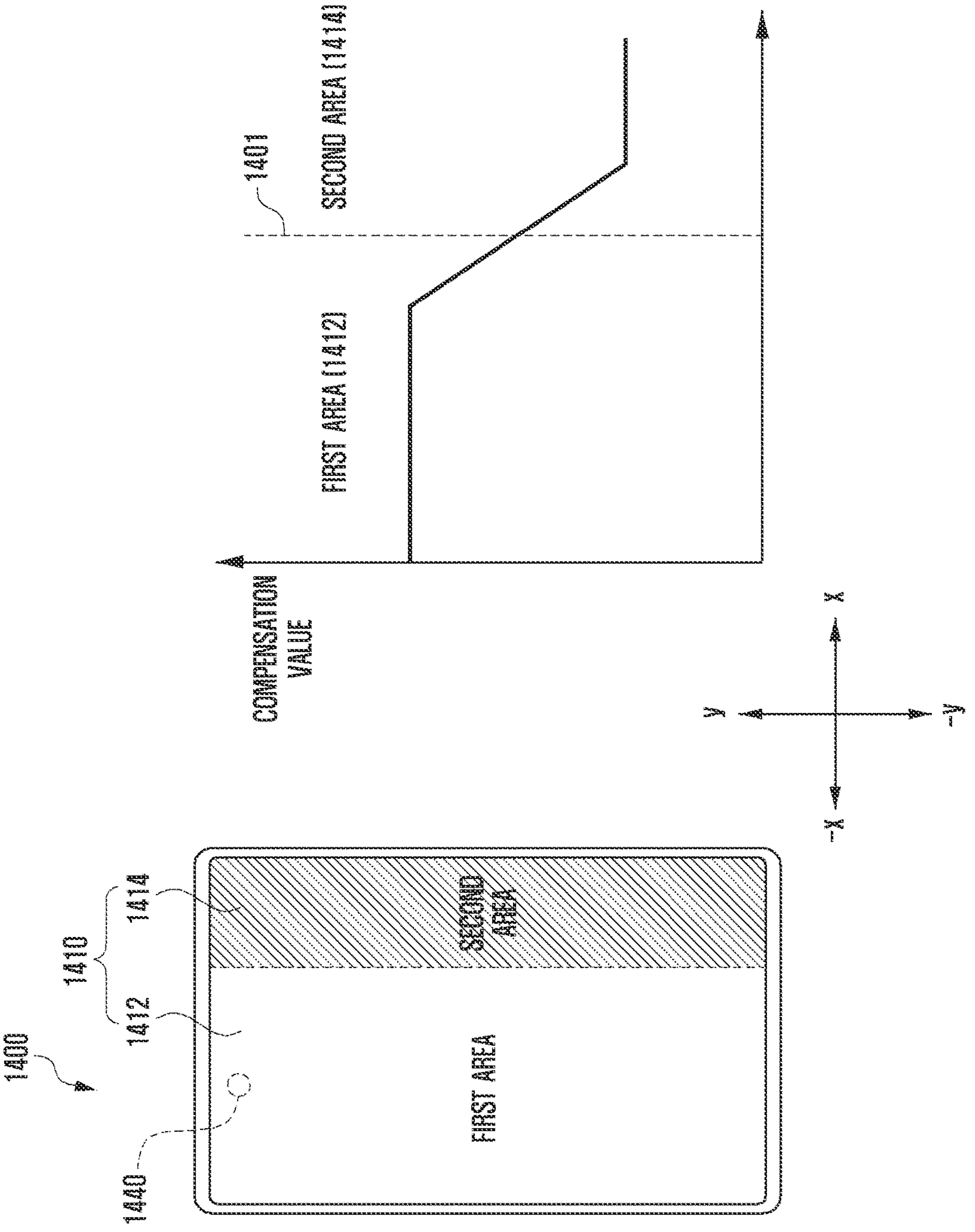
FIG. 15 is a view illustrating compensating for deterioration of a low temperature color filter (LTCF) by dividing a first area (e.g., a main area, a fixed area) and a second area (e.g., a sub-area, an expandable area) of a display according to an embodiment of the disclosure.

FIG. 14 is a view illustrating, when an electronic device includes a slidable display, a first area (e.g., a main area and a fixed area) and a second area (e.g., a sub-area, and an expandable area) of the display according to an embodiment of the disclosure. FIG. 15 is a view illustrating compensating for deterioration of a low temperature color filter (LTCF) by dividing a first area (e.g., a main area, and a fixed area) and a second area (e.g., a sub-area, and an expandable area) of a display according to an embodiment of the disclosure.

Referring to FIGS. 14 and 15, an electronic device 1400, according to various embodiments of the disclosure, may include a display 1410, a first housing 1420, a second housing 1430, and at least one ambient light sensor 1440. In addition, the electronic device 1400 according to various embodiments of the disclosure may include a position sensor (e.g., the position sensor 760 in FIG. 7) (e.g., a global positioning system (GPS)), and an posture sensor (e.g., the posture sensor 770 in FIG. 7) (e.g., a six-axis sensor) (e.g., a gesture sensor, a gyro sensor, a barometric pressure sensor, and/or an acceleration sensor).

In an embodiment of the disclosure, the display 1410 (e.g., the display 200 in FIGS. 2 and 3) may include a top emission type or bottom emission type of OLED display. The OLED display may include a low temperature color filter (LTCF) layer, a window glass (e.g., an ultra-thin glass (UTG) or polymer window), and an optical compensation film (e.g., an optical compensation film (OCF)). Here, a polarizing film (or polarizing layer) may be replaced by the LTCF layer of the OLED display.

In an embodiment of the disclosure, the display 1410 may include a first area 1412 (e.g., a main area and a fixed area) that is visually exposed to the outside when a screen is reduced, and a second area 1414 (e.g., a sub-area and an expandable area) that is visually exposed to the outside when the screen is expanded.

In an embodiment of the disclosure, the display 1410 may be disposed in a space provided by the first housing 1420 and the second housing 1430. The second housing 1430 may slide in a first direction (e.g., in the X-axis direction) and a second direction (e.g., in the −X-axis direction). The second housing 1430 may slide in the first direction (e.g., in the x-axis direction) when the screen is expanded, such that at least a portion of the second housing 1430 is exposed to the outside. When the second housing 1430 slides in the first direction (e.g., in the x-axis direction), the display 1410 may be at least partially retracted to visually expose the second area 1414 (e.g., a sub-area and an expandable area) to the outside, thereby expanding the screen. When the screen is reduced, the second housing 1430 may slide in the second direction (e.g., in the −x-axis direction) such that at least a portion of the second housing 1430 is drawn inside the first housing 1420. When the second housing 1430 slides in the second direction (e.g., in the −x-axis direction), at least a portion of the display 1410 may be drawn in, such that only the first area 1412 (e.g., a main area and a fixed area) is visually exposed to the outside.

In an embodiment of the disclosure, even if the first area 1412 (e.g., a main area and a fixed area) and the second area 1414 (e.g., a sub-area and an expandable area) of the display 1410 are positioned on the same plane, the amount of time that the first area 1412 (e.g., a main area and a fixed area) and the second area 1414 (e.g., a sub-area and an expandable area) are exposed to external light may vary depending on screen expansion or screen reduction.

In an embodiment of the disclosure, the first area 1412 (e.g., a main area and a fixed area) of the display 1410 may be visually exposed to the outside in a state of screen reduction and a state of screen expansion, and the second area 1414 (e.g., a sub-area and an expandable area) may be visually exposed to the outside only in a state of screen expansion. Therefore, the LTCF of the first area 1412 (e.g., a main area and a fixed area) may be more deteriorated than the LTCF of the second area 1414 (e.g., a sub-area and an expandable area).

Referring to FIGS. 13, 14, and 15, in an embodiment of the disclosure, the processor (e.g., the processor 710 in FIG. 7) may perform color deviation compensation of pixels in response to deterioration of the LTCF of the first area 1412 (e.g., a main area and fixed area) of the display 1410 and deterioration of the LTCF of the second area 1414 (e.g., a sub-area and an expandable area). The processor (e.g., the processor 710 in FIG. 7) may compensate for LTCF deterioration with a first compensation value for pixels in the first area 1412 (e.g., a main area and a fixed area). The processor (e.g., the processor 710 in FIG. 7) may perform color deviation compensation for the pixels in the second area 1414 (e.g., a sub-area and an expandable area) in response to LTCF deterioration with a second compensation value that is smaller than the first compensation value.

In an embodiment of the disclosure, color deviation compensation for pixels in a boundary portion 1401 of the first area 1412 (e.g., a main area and fixed area) and the second area 1414 (e.g., a sub-area and an expandable area) of the display 1410 may be performed by interpolating an intermediate value between the first compensation value and the second compensation value.

In an embodiment of the disclosure, upon compensating for color deviation of pixels in the first area 1412 and second area 1414 of the display 1410, a gamma correction of each of the plurality of pixels may be performed to compensate for the color deviation.

In an embodiment of the disclosure, color deviation compensation of the first area 1412 (e.g., a main area and a fixed area) and the second area 1414 (e.g., a sub-area and an expandable area) of the display 1410 may be performed by the processor (e.g., the processor 710 in FIG. 7) or by the DDI (e.g., the DDI 720 in FIG. 7).

For example, in case that color deviation compensation of the first area 1412 (e.g., a main area, and fixed area) and the second area 1414 (e.g., a sub-area, and an expandable area) of the display 1410 is performed by the processor (e.g., the processor 710 in FIG. 7), the processor (e.g., the processor 710 in FIG. 7) may apply a compensation value to an image data value of each pixel, and transmit the image data of each pixel with the compensation value applied to the DDI (e.g., the DDI 720 in FIG. 7).

For example, in case that the color deviation compensation of the first area 1412 (e.g., a main area and fixed area) and the second area 1414 (e.g., a sub-area and an expandable area) of the display 1410 is performed in the DDI (e.g., the DDI 720 in FIG. 7), the processor (e.g., the processor 710 in FIG. 7) may transmit image data of each pixel to the DDI (e.g., the DDI 720 in FIG. 7), and may apply a compensation value to an image data value of each pixel in the DDI (e.g., the DDI 720 in FIG. 7).

Figure 16:
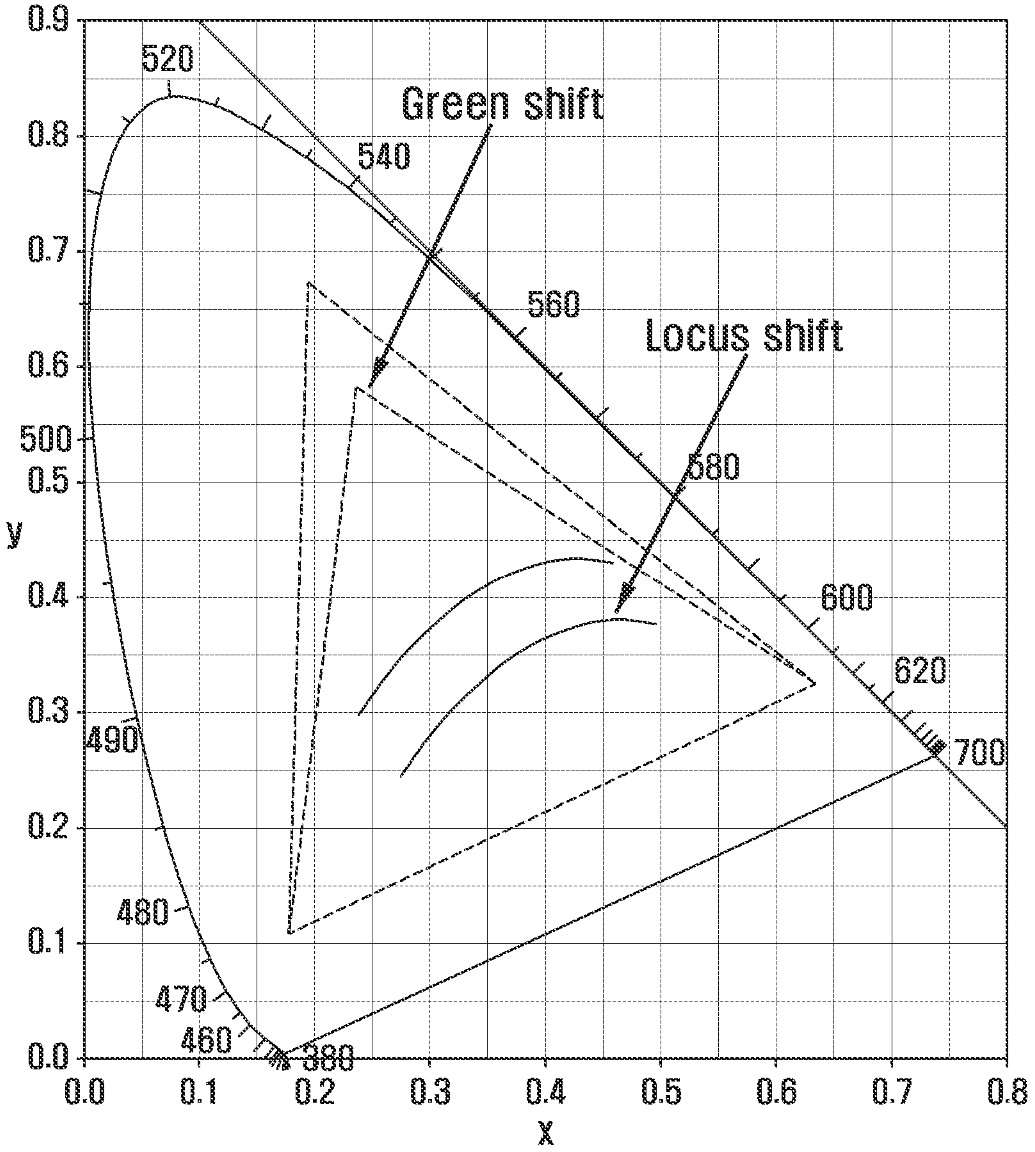
FIG. 16 is a view illustrating color coordinates for compensating for deterioration of a low temperature color filter (LTCF) of a display of an electronic device according to an embodiment of the disclosure.
Figure 17:
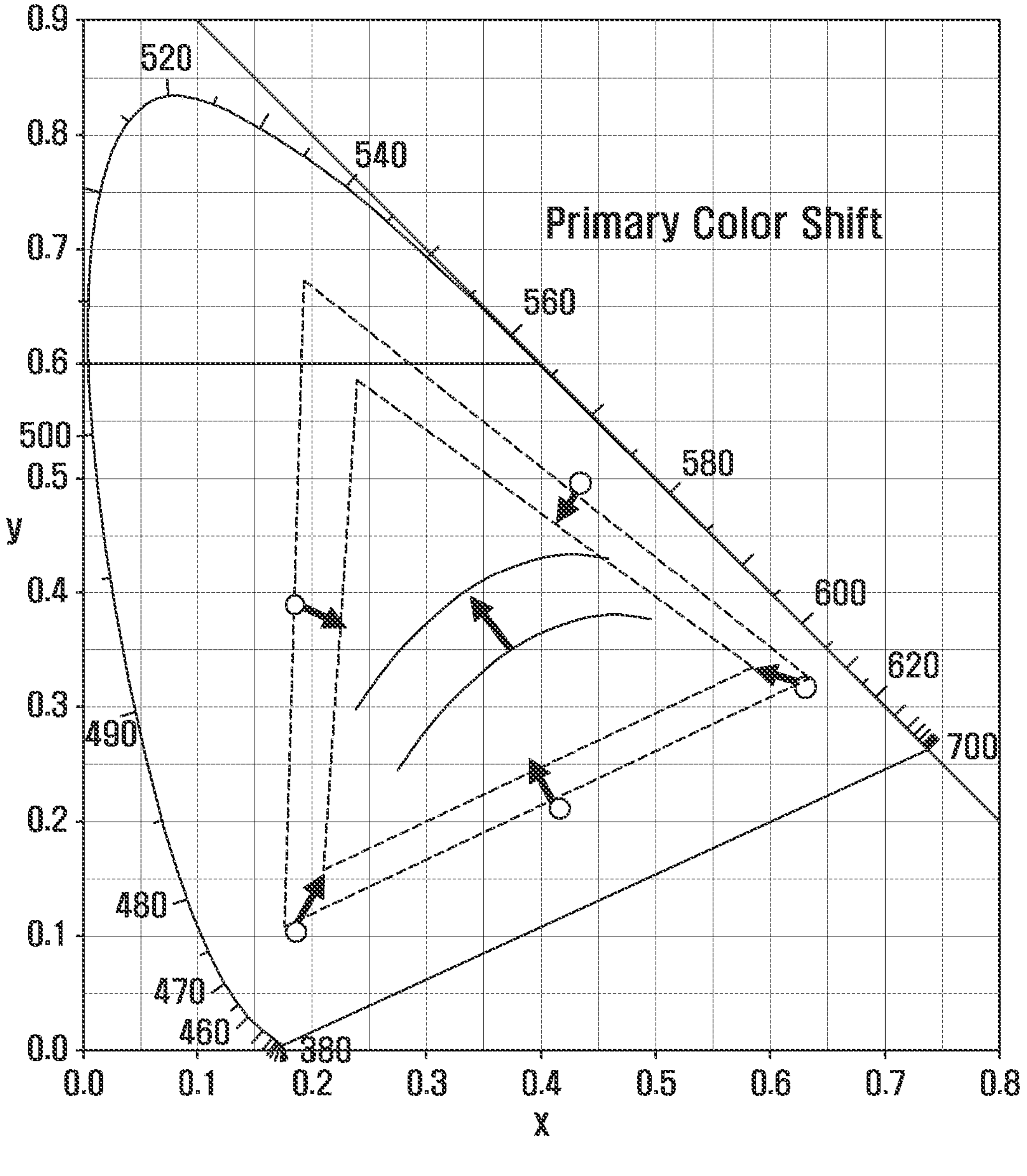
FIG. 17 is a view illustrating adjusting a primary color point through data compensation of red, green, and blue pixels in order to compensate for deterioration of a low temperature color filter (LTCF) of a display of an electronic device according to an embodiment of the disclosure.

FIG. 16 is a view illustrating color coordinates for compensating for deterioration of a low temperature color filter (LTCF) of a display of an electronic device according to an embodiment of the disclosure. FIG. 17 is a view illustrating adjusting a primary color point through data compensation of red, green, and blue pixels in order to compensate for deterioration of a low temperature color filter (LTCF) of a display of an electronic device according to an embodiment of the disclosure.

Referring to FIGS. 16 and 17, upon compensating for color deviation in response to performance deterioration of the LTCFs of the first area and second area of the display 1110, 1210, or 1410, the compensation may be performed by reducing light emission intensity of a primary color point. In an embodiment of the disclosure, color deviation compensation may be performed in a manner that adjusts the primary color point of each pixel (RGBCMYK Cube Control).

In an embodiment of the disclosure, in case that green color is deteriorated, there may be a distortion in Planckian locus (or black body locus), causing white balance to be distorted. When the white balance is distorted due to the deterioration of the green color, data of red color and blue color may be compensated to move distorted color coordinates to the original coordinates (locus shift) to restore the white balance.

An electronic device (e.g., the electronic device 101 in FIGS. 3 and 4, the electronic device 700 in FIG. 7, the electronic device 800 in FIG. 8, the electronic device 900 in FIG. 9, the electronic device 1100 in FIG. 11, the electronic device 1200 in FIG. 12, or the electronic device 1400 in FIG. 14) according to various embodiments of the disclosure may include, a display (e.g., the display 200 in FIG. 2, the display 200 in FIGS. 3 and 4, the OLED display 600 in FIG. 6, the OLED display 740 in FIG. 7, the OLED display 830 in FIG. 8, the OLED display 930 in FIG. 9, 1110, 1210, or 1410), at least one optical sensor (750, 820, 920, 1140, 1150, 1240, or 1440), a display driver (e.g., the display driver 230 in FIG. 2 or the display driver 720 in FIG. 7), a processor (e.g., the processor 120 of FIG. 1 or the processor 710 of FIG. 7), and a memory (e.g., the memory 130 in FIG. 1). The display 200, 600, 740, 830, 930, 1110, 1210, or 1410 may include a plurality of pixels (e.g., pixels P in FIG. 5) and a plurality of color filters (e.g., LTCF in FIG. 6, 8, or 9) disposed on an upper portion of the plurality of pixels P. The at least one optical sensor (e.g., the ambient light sensor 750 in FIG. 7, the ambient light sensor module 820 in FIG. 8, the ambient light sensor module 920 in FIG. 9, the first ambient light sensor 1140 in FIG. 11, the second ambient light sensor 1150 in FIG. 11, the ambient light sensor 1240 in FIG. 12, or the ambient light sensor 1440 in FIG. 14) may generate a value of exposure to ultraviolet rays based on the degree of exposure to ultraviolet rays of the plurality of color filters LTCF. The display driver 230 or 720 may control driving of the display 200, 600, 740, 830, 930, 1110, 1210, or 1410. The processor 120 or 710 may control driving of the display driver 230 or 720. The memory 130 may be operatively coupled to the processor 120 or 710. The memory 130 may store instructions which, when executed, allow the processor 120 or 170 to calculate a radiant exposure based on the value of exposure to ultraviolet rays and exposure time, and compensate color deviation of the plurality of pixels in accordance with deterioration of the plurality of color filters LTCF based on the radiant exposure.

According to an embodiment of the disclosure, the processor 120 or 710 may compensate for color deviation of the plurality of pixels P in response to deterioration of the plurality of color filters LTCF according to a cumulative amount of ultraviolet rays.

According to an embodiment of the disclosure, the processor 120 or 710 may perform a gamma correction of each of the plurality of pixels P to compensate for color deviation.

According to an embodiment of the disclosure, the plurality of color filters LTCF may include a low temperature color filter (LTCF).

According to an embodiment of the disclosure, the at least one optical sensor 750, 820, 920, 1140, 1150, 1240, or 1440 may be disposed at a lower portion of the display 200, 600, 740, 830, 930, 1110, 1210, or 1410.

According to an embodiment of the disclosure, the at least one optical sensor 750, 820, 920, 1140, 1150, 1240, or 1440 may be disposed in a bezel area (the bezel area 903 in FIG. 9) of the electronic device 101, 700, 800, 900, 1100, 1200, or 1400.

According to an embodiment of the disclosure, the at least one optical sensor 750, 820, 920, 1140, 1150, 1240, or 1440 may be disposed in the same plane as the plurality of pixels P in an active area (e.g., the active area 802 of FIGS. 8 and 9) of the display 200, 600, 740, 830, 930, 1110, 1210, or 1410.

According to an embodiment of the disclosure, an electronic device 101, 700, 800, 900, 1100, 1200, or 1400 according to various embodiments of the disclosure may include a position sensor that generates position data based on a position of the electronic device 101, 700, 800, 900, 1100, 1200, or 1400 and an posture sensor (e.g., the posture sensor 770 of FIG. 7) that generates posture data based on a posture of the electronic device 101, 700, 800, 900, 1100, 1200, or 1400.

According to an embodiment of the disclosure, the display 200, 600, 740, 830, 930, 1110, 1210, or 1410 may include a first area (e.g., the first area 1112 in FIG. 11 and the first area 1212 in FIG. 12) and a second area (e.g., the first area 1114 in FIG. 11 and the second area 1214 in FIG. 12) that are disposed to be unfolded and spaced apart from each other in a first state and adjacent to each other in a second state.

According to an embodiment of the disclosure, the at least one optical sensor 750, 820, 920, 1140, 1150, 1240, or 1440 may be disposed at a lower portion of the first area 1112 or 1212 and at a lower portion of the second area 1114 or 1214, respectively.

According to an embodiment of the disclosure, a first optical sensor 750, 820, 920, 1140, 1150, 1240, or 1440 disposed at a lower portion of the first area 1112 or 1212 may be used to generate a first value of exposure to ultraviolet rays based on the degree of exposure to ultraviolet rays of a plurality of first color filters LTCF disposed in the first area 1112 or 1212. A second optical sensor 750, 820, 920, 1140, 1150, 1240, or 1440 disposed at a lower portion of the second area 1114 or 1214 may be used to generate a second value of exposure to ultraviolet rays based on the degree of exposure to ultraviolet rays of the plurality of second color filters LTCF disposed in the second area 1114 or 1214. Color deviation of the plurality of first pixels P disposed in the first area 1112 or 1212 may be compensated for based on the first value of exposure to ultraviolet rays. Color deviation of the plurality of second pixels P disposed in the second area 1114 or 1214 may be compensated for based on the second value of exposure to ultraviolet rays.

According to an embodiment of the disclosure, the at least one optical sensor 750, 820, 920, 1140, 1150, 1240, or 1440 may be disposed one of a lower portion of the first area 1112 or 1212 and a lower portion of the second area 1114 or 1214.

According to an embodiment of the disclosure, an optical sensor 750, 820, 920, 1140, 1150, 1240, or 1440 disposed at a lower portion of the first area 1112 or 1212 may be used to generate a first value of exposure to ultraviolet rays based on the degree of exposure to ultraviolet rays of a plurality of first color filters LTCF disposed in the first area 1112 or 1212. A second value of exposure to ultraviolet rays based on the degree of exposure to ultraviolet rays of the plurality of second color filters LTCF disposed in the second area 1114 or 1214, may be generated based on a first value of exposure to ultraviolet rays in the first area 1112 or 1212, an angle between the first area 1112 or 1212 and the second area 1114 or 1214, and normal vectors (e.g., the first normal vector 1260 and the second normal vector 1270 in FIG. 12) of the first area 1112 or 1212 and the second area 1114 or 1214 based on the position data and the posture data. Color deviation of the plurality of first pixels P disposed in the first area 1112 or 1212 may be compensated for based on the first value of exposure to ultraviolet rays. Color deviation of the plurality of second pixels P disposed in the second area 1114 or 1214 may be compensated for based on the second value of exposure to ultraviolet rays.

According to an embodiment of the disclosure, the display 200, 600, 740, 830, 930, 1110, 1210, or 1410 may include a first area (e.g., the first area 1412 in FIG. 14) and a second area (e.g., the second area 1414 in FIG. 14), at least a portion of which slide in a first direction for the first and second areas to be exposed to the outside in a first state. At least a portion of the first area and second area may slide in a second direction opposite to the first direction in a second state, and only the first area 1412 may be visually exposed to the outside.

According to an embodiment of the disclosure, the at least one optical sensor 750, 820, 920, 1140, 1150, 1240, or 1440 may be disposed at a lower portion of the first area 1412.

According to an embodiment of the disclosure, an optical sensor 750, 820, 920, 1140, 1150, 1240, or 1440 disposed at a lower portion of the first area 1412 may be used to generate a first value of exposure to ultraviolet rays based on the degree of exposure to ultraviolet rays of a plurality of first color filters LTCF disposed in the first area 1412. Color deviation of the plurality of first pixels P disposed in the first area 1412 may be compensated for based on the first value of exposure to ultraviolet rays.

According to an embodiment of the disclosure, the plurality of first pixels P disposed in the first area 1412 may be compensated for color deviation with a first compensation value. A plurality of second pixels P disposed in the second area 1414 may be compensated for color deviation with a second compensation value that is smaller than the first compensation value.

According to an embodiment of the disclosure, a plurality of pixels P disposed at a boundary of the first area 1412 and the second area 1414 may be compensated for color deviation by interpolating an intermediate value between the first compensation value and the second compensation value.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:

a display including a plurality of pixels and a plurality of color filters disposed on an upper portion of the plurality of pixels, wherein the plurality of color filters include red, green, and blue low temperature color filters (LTCFs) replacing a polarizing film;

at least one optical sensor configured to generate a value of exposure to ultraviolet rays based on a degree of exposure to ultraviolet rays of the red, green, and blue LTCFs;

a display driver configured to control driving of the display;

memory storing one or more computer programs; and one or more processors communicatively coupled to the display, the at least one optical sensor, the display driver, and the memory, wherein the one or more computer programs include computer-executable instructions which, when executed by the one or more processors individually or collectively, cause the electronic device to:

calculate a radiant exposure based on the value of exposure to ultraviolet rays and an amount of exposure time, obtain a difference value of deterioration among the red, green, and blue LTCFs based on the radiant exposure, and compensate color deviation of the plurality of pixels in accordance with the difference value of deterioration of the red, green, and blue LTCFs.

2. The electronic device of claim 1, wherein the one or more computer programs further include computer-executable instructions which, when executed by the one or more processors individually or collectively, cause the electronic device to:

compensate for color deviation of the plurality of pixels in response to deterioration of the red, green, and blue LTCFs based on a cumulative amount of ultraviolet rays.

3. The electronic device of claim 1, wherein the one or more computer programs further include computer-executable instructions which, when executed by the one or more processors individually or collectively, cause the electronic device to:

compensate for color deviation by performing a gamma correction of each of the plurality of pixels.

4. The electronic device of claim 1, wherein the at least one optical sensor is disposed on a lower portion of the display.

5. The electronic device of claim 1, wherein the at least one optical sensor is disposed in a bezel area of the electronic device.

6. The electronic device of claim 1, wherein the at least one optical sensor is disposed in a same plane as the plurality of pixels in an active area of the display.

7. The electronic device of claim 1, further comprising:

a position sensor configured to generate position data based on a position of the electronic device; and a posture sensor configured to generate posture data based on a posture of the electronic device.

8. The electronic device of claim 7, wherein the display comprises a first area and a second area that are disposed to be unfolded and spaced apart from each other in a first state and adjacent to each other in a second state.

9. The electronic device of claim 8, wherein the at least one optical sensor is disposed at a lower portion of the first area and at a lower portion of the second area, respectively.

10. The electronic device of claim 9, wherein the one or more computer programs further include computer-executable instructions which, when executed by the one or more processors individually or collectively, cause the electronic device to:

generate a first value of exposure to ultraviolet rays based on the degree of exposure to ultraviolet rays of a plurality of first color filters disposed in the first area, using a first optical sensor disposed in a lower portion of the first area, generate a second value of exposure to ultraviolet rays based on the degree of exposure to ultraviolet rays of a plurality of second color filters disposed in the second area, using a second optical sensor disposed in a lower portion of the second area, compensate for color deviations of a plurality of first pixels disposed in the first area, based on the first value of exposure to ultraviolet rays, and compensate for color deviation of a plurality of second pixels disposed in the second area, based on the second value of exposure to ultraviolet rays.

11. The electronic device of claim 10, wherein the at least one optical sensor is disposed at one of a lower portion of the first area or a lower portion of the second area.

12. The electronic device of claim 11, wherein the one or more computer programs further include computer-executable instructions which, when executed by the one or more processors individually or collectively, cause the electronic device to:

generate a first value of exposure to ultraviolet rays based on the degree of exposure to ultraviolet rays of the plurality of first color filters disposed in the first area, using the at least one optical sensor disposed in a lower portion of the first area, generate a second value of exposure to ultraviolet rays based on the degree of exposure to ultraviolet rays of the plurality of second color filters disposed in the second area based on a first value of exposure to ultraviolet rays of the first area, an angle between the first area and the second area, and normal vectors of the first area and the second area based on the position data and the posture data, compensate for color deviations of the plurality of first pixels disposed in the first area based on the first value of exposure to ultraviolet rays, and compensate for color deviations of the plurality of second pixels disposed in the second area based on the second value of exposure to ultraviolet rays.

13. The electronic device of claim 1, wherein the display includes a first area and a second area, wherein at least a portion of the display is slidable in a first direction to be visually exposed to an outside of the electronic device in a first state, and wherein the display is slidable in a second direction opposite the first direction in a second state such that only the first area is visually exposed to the outside.

14. The electronic device of claim 13, wherein the at least one optical sensor is disposed in a lower portion of the first area.

15. The electronic device of claim 14, wherein the one or more computer programs further include computer-executable instructions which, when executed by the one or more processors individually or collectively, cause the electronic device to:

generate a first value based on the degree of exposure to ultraviolet rays of a plurality of first color filters disposed in the first area using the at least one optical sensor disposed at a lower portion of the first area, and compensate for color deviations of a plurality of first pixels disposed in the first area based on the first value of exposure to ultraviolet rays.

16. The electronic device of claim 15, wherein the plurality of first pixels disposed in the first area compensate for color deviation with a first compensation value, and wherein a plurality of second pixels disposed in the second area compensate for color deviation with a second compensation value that is less than the first compensation value.

17. The electronic device of claim 16, wherein a plurality of pixels disposed at a boundary of the first area and the second area compensate for color deviation by interpolating an intermediate value between the first compensation value and the second compensation value.

* * * * *